United States Patent
Noda et al.

(10) Patent No.: US 8,815,662 B2
(45) Date of Patent: Aug. 26, 2014

(54) METHOD FOR MANUFACTURING SOI SUBSTRATE AND SEMICONDUCTOR DEVICE

(75) Inventors: Kosei Noda, Atsugi (JP); Toshihiko Takeuchi, Atsugi (JP); Makoto Ishikawa, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 237 days.

(21) Appl. No.: 12/949,283

(22) Filed: Nov. 18, 2010

(65) Prior Publication Data

US 2011/0124164 A1   May 26, 2011

(30) Foreign Application Priority Data

| Nov. 24, 2009 | (JP) | 2009-266150 |
| Nov. 24, 2009 | (JP) | 2009-266151 |
| Nov. 24, 2009 | (JP) | 2009-266152 |

(51) Int. Cl.
    *H01L 21/00* (2006.01)
(52) U.S. Cl.
    USPC ............................................... 438/166
(58) Field of Classification Search
    USPC ............................................... 438/166
    See application file for complete search history.

(56) References Cited

U.S. PATENT DOCUMENTS

| 4,180,618 A | 12/1979 | Alpha et al. |
| 4,496,788 A | 1/1985 | Hamakawa et al. |
| 4,633,034 A | 12/1986 | Nath et al. |
| 4,727,047 A | 2/1988 | Bozler et al. |
| 4,816,420 A | 3/1989 | Bozler et al. |
| 5,371,037 A | 12/1994 | Yonehara |
| 5,424,244 A | 6/1995 | Zhang et al. |
| 5,665,607 A | 9/1997 | Kawama et al. |
| 5,736,431 A | 4/1998 | Shinohara et al. |
| 5,750,000 A | 5/1998 | Yonehara |
| 5,789,284 A | 8/1998 | Yamazaki et al. |
| 5,811,348 A | 9/1998 | Matsushita et al. |
| 5,840,616 A | 11/1998 | Sakaguchi et al. |
| 5,849,043 A | 12/1998 | Zhang et al. |
| 5,854,123 A | 12/1998 | Sato et al. |
| 6,071,766 A | 6/2000 | Yamazaki et al. |
| 6,190,937 B1 | 2/2001 | Nakagawa et al. |
| 6,251,754 B1 * | 6/2001 | Ohshima et al. ............. 438/506 |

(Continued)

FOREIGN PATENT DOCUMENTS

| JP | 06-283422 A | 10/1994 |
| JP | 07-249574 A | 9/1995 |

(Continued)

*Primary Examiner* — Shaun Campbell
(74) *Attorney, Agent, or Firm* — Eric J. Robinson; Robinson Intellectual Property Law Office, P.C.

(57) ABSTRACT

An amorphous semiconductor layer is formed over a first single crystal semiconductor layer provided over a glass substrate or a plastic substrate with an insulating layer therebetween. The amorphous semiconductor layer is formed by a CVD method at a deposition temperature of higher than or equal to 100° C. and lower than or equal to 275° C. with use of a silane-based gas not diluted. Heat treatment is performed so that the amorphous semiconductor layer solid-phase epitaxially grows. In such a manner, an SOI substrate including a thick single crystal semiconductor layer is manufactured.

16 Claims, 24 Drawing Sheets

(1 of 24 Drawing Sheet(s) Filed in Color)

(56) References Cited

U.S. PATENT DOCUMENTS

| | | |
|---|---|---|
| 6,284,629 B1 | 9/2001 | Yokokawa et al. |
| 6,331,208 B1 | 12/2001 | Nishida et al. |
| 6,358,784 B1 | 3/2002 | Zhang et al. |
| 6,372,609 B1 | 4/2002 | Aga et al. |
| 6,380,046 B1 | 4/2002 | Yamazaki |
| 6,387,829 B1 | 5/2002 | Usenko et al. |
| 6,399,429 B1 | 6/2002 | Yamoto et al. |
| 6,534,380 B1 | 3/2003 | Yamauchi et al. |
| 6,566,277 B1 | 5/2003 | Nakagawa et al. |
| 6,605,518 B1 | 8/2003 | Ohmi et al. |
| RE38,266 E | 10/2003 | Yamazaki et al. |
| 6,655,767 B2 | 12/2003 | Zhang et al. |
| 6,656,271 B2 | 12/2003 | Yonehara et al. |
| 6,692,981 B2 | 2/2004 | Takato et al. |
| 6,818,529 B2 | 11/2004 | Bachrach et al. |
| 7,169,657 B2 | 1/2007 | Zhang et al. |
| 7,781,271 B2 | 8/2010 | Zhang et al. |
| 7,781,308 B2 | 8/2010 | Isaka et al. |
| 7,842,584 B2 | 11/2010 | Kato et al. |
| 7,842,586 B2 | 11/2010 | Yamazaki |
| 7,910,929 B2 | 3/2011 | Takayama et al. |
| 7,985,604 B2 | 7/2011 | Isaka et al. |
| 8,008,169 B2 | 8/2011 | Ohnuma et al. |
| 8,143,087 B2 | 3/2012 | Isaka et al. |
| RE43,450 E | 6/2012 | Yamazaki et al. |
| 8,368,075 B2 | 2/2013 | Yamazaki |
| 8,420,504 B2 | 4/2013 | Kato et al. |
| 2001/0046746 A1 | 11/2001 | Yokokawa et al. |
| 2002/0045302 A1* | 4/2002 | Zhang et al. .......... 438/199 |
| 2004/0056332 A1 | 3/2004 | Bachrach et al. |
| 2007/0019032 A1* | 1/2007 | Maekawa et al. ....... 347/45 |
| 2007/0119815 A1* | 5/2007 | Zhang et al. ........... 216/63 |
| 2008/0099065 A1 | 5/2008 | Ito et al. |
| 2008/0160661 A1 | 7/2008 | Henley |
| 2008/0245406 A1 | 10/2008 | Yamazaki et al. |
| 2009/0142879 A1* | 6/2009 | Isaka et al. ............ 438/96 |
| 2009/0162992 A1 | 6/2009 | Kato et al. |
| 2010/0120228 A1* | 5/2010 | Saito et al. ........... 438/463 |
| 2011/0165740 A1 | 7/2011 | Takayama et al. |

FOREIGN PATENT DOCUMENTS

| | | |
|---|---|---|
| JP | 11-047204 A | 2/1999 |
| JP | 11-074209 A | 3/1999 |
| JP | 2000-030995 A | 1/2000 |
| JP | 2003-197536 A | 7/2003 |
| JP | 2007-043192 A | 2/2007 |
| JP | 2007-184505 A | 7/2007 |
| JP | 2009-071280 A | 4/2009 |
| JP | 2009-177145 A | 8/2009 |
| JP | 2009-177147 A | 8/2009 |

\* cited by examiner

FIG. 5A
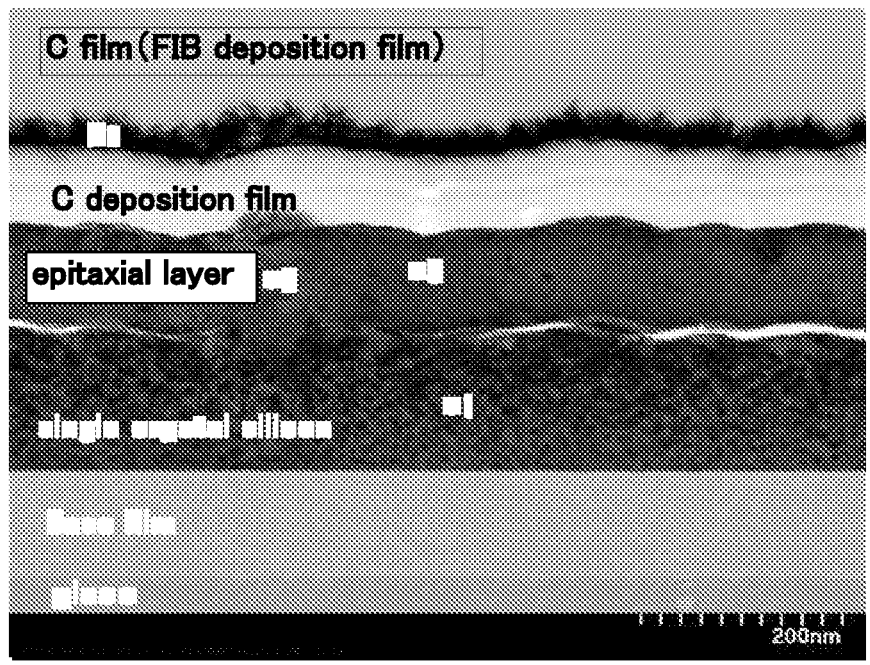
FIG. 5B     FIG. 5C     FIG. 5D
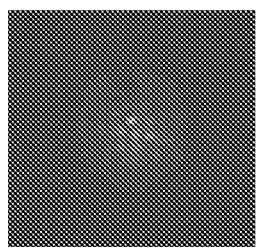
Diffraction ※1
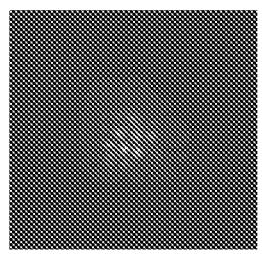
Diffraction ※2
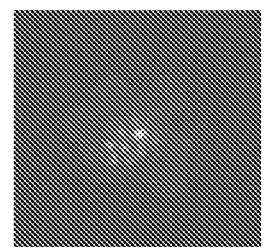
Diffraction ※3

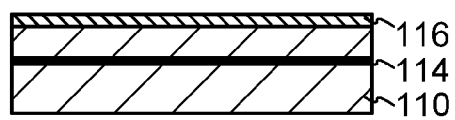
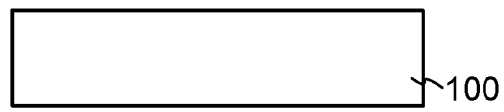
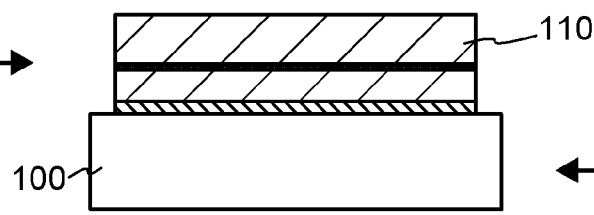
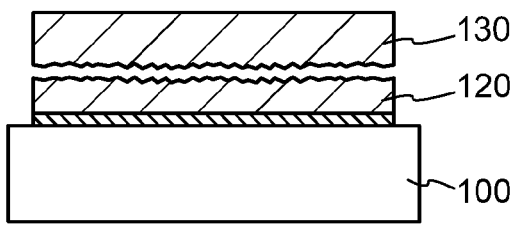
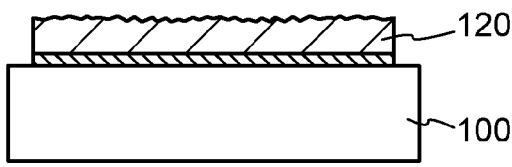

FIG. 9A
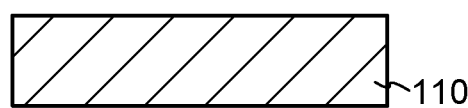
FIG. 9B
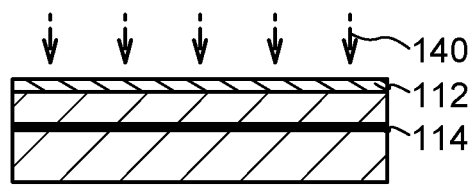
FIG. 9C

FIG. 11A
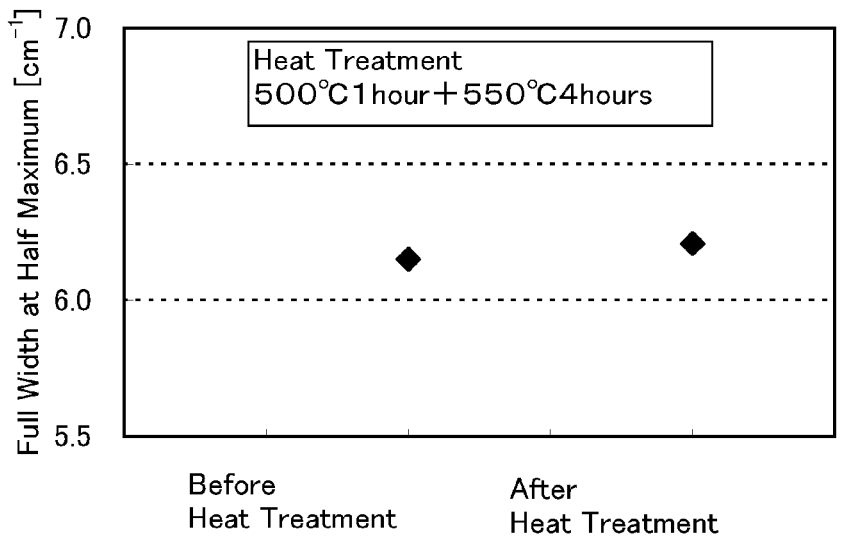
FIG. 11B
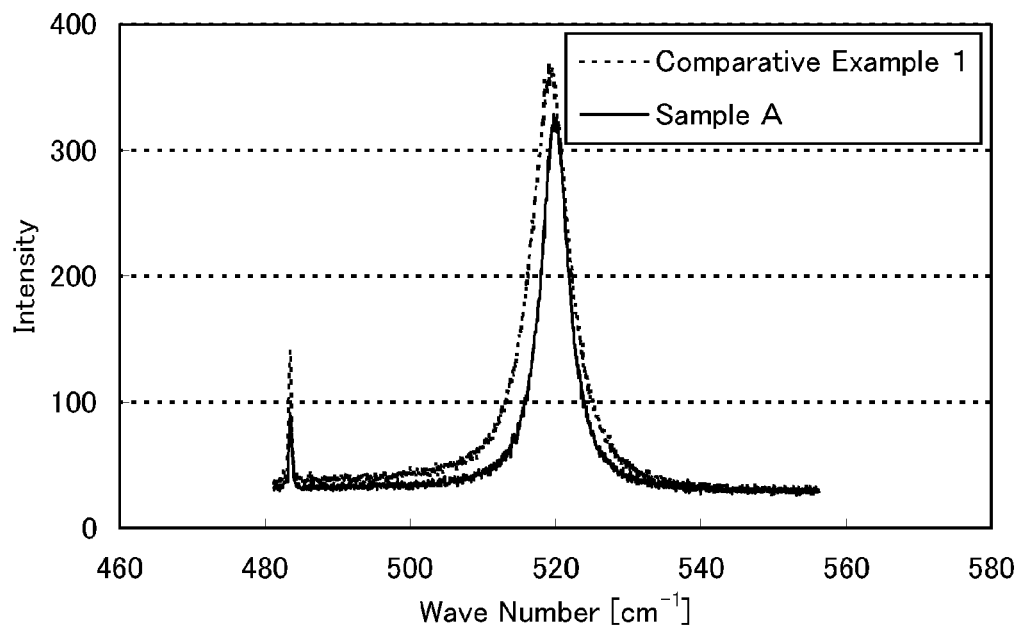
FIG. 11C
| | Full Width at Half Maximum [cm$^{-1}$] |
|---|---|
| Comparative Example 1 | 6.21 |
| Sample A | 4.51 |

METHOD FOR MANUFACTURING SOI SUBSTRATE AND SEMICONDUCTOR DEVICE

BACKGROUND OF THE INVENTION

1. Field of the Invention

The present invention relates to a method for manufacturing a silicon-on-insulator (SOI) substrate, a semiconductor device using the SOI substrate, and a method for manufacturing the semiconductor device.

2. Description of the Related Art

In recent years, a silicon-on-insulator (SOI) substrate has been used for a semiconductor device for a high-performance device. By utilizing features of a thin single crystal silicon layer formed over an insulating layer, transistors formed in the integrated circuit can be electrically separated from each other completely. Further, each transistor can be formed as a fully-depleted transistor, and thus a semiconductor integrated circuit with high added value such as high integration, high speed driving, and low power consumption can be realized.

As a method for manufacturing such an SOI substrate, a so-called hydrogen ion implantation separation method in which hydrogen ion implantation and separation are combined is known. A typical process of a hydrogen ion implantation separation method will be described below.

First, hydrogen ions are implanted into a silicon substrate to form an ion implantation layer at a predetermined depth from a surface of the substrate. Then, another silicon substrate which functions as a base substrate (a supporting substrate) is oxidized to form a silicon oxide layer on its surface. After that, the silicon substrate into which the hydrogen ions are implanted and the silicon oxide layer on the other silicon substrate functioning as the base substrate are disposed in close contact with each other, so that the two silicon substrates are bonded to each other. Then, heat treatment is performed, so that one of the silicon substrates is split and a thin single crystal silicon layer is formed on the base substrate side.

The single crystal silicon layer formed by the above method is very thin and has a thickness of approximately 50 nm to 300 nm in general. Therefore, the single crystal silicon layer formed by the above method is really suitable for a transistor for which high integration, high speed driving, and low power consumption are needed. On the other hand, in the case where use of a power device, a photoelectric conversion device, and the like is considered, the single crystal silicon layer needs to have a certain thickness from the viewpoint of improvement in withstand voltage, improvement in photoelectric conversion efficiency, and the like.

The thickness of a single crystal silicon layer formed by a hydrogen ion implantation separation method mainly depends on accelerating voltage in a step of ion implantation. Since an ion implantation layer is formed in a shallow region when accelerating voltage is reduced, the single crystal silicon layer is formed thin. On the other hand, when accelerating voltage is increased, the single crystal semiconductor layer is formed thick.

This shows that acceleration voltage needs to be increased simply to make the single crystal semiconductor layer thick. However, it is not practically easy to form a thick single crystal semiconductor layer while increasing accelerating voltage. This is because, in the case of using an ion implantation apparatus suitable for mass production (an apparatus capable of supplying a large amount of current), accelerating voltage cannot be more increased than a certain level due to its limit. In the case of using an ion implantation apparatus in which a small amount of current is supplied, acceleration voltage can be increased. However, it takes time to obtain a predetermined injection volume of ions, so that it is not preferable in terms of productivity. Further, in the case where ions are accelerated by high voltage exceeding 100 kV, harmful radiation may be generated; therefore, there is a safety problem.

In order to solve the above-mentioned problems, a method is examined in which a single crystal semiconductor layer is made thick not by acceleration voltage in a step of ion implantation but by epitaxial growth (for example, see Patent Documents 1 and 2).

In Patent Document 1, a silane-based gas is subjected to hydrogen reduction to epitaxially grow on a single crystal semiconductor layer at 1100° C. to 1200° C. by vapor-phase growth (vapor-phase epitaxial growth) such as a chemical vapor deposition (CVD) method. Alternatively, the silane-based gas is made to epitaxially grow at 600° C. to 900° C. by a molecular beam epitaxy method.

In Patent Document 2, an amorphous silicon layer is provided on a surface of a single crystal semiconductor layer by a plasma CVD method or the like. After that, heat treatment is performed at 1100° C. or higher for 60 minutes, so that the amorphous silicon layer is made to solid-phase epitaxially grow with the use of the single crystal semiconductor layer as a nucleus.

In Patent Document 3 that is a patent application, in order that epitaxial growth proceeds on a single crystal silicon layer, laser treatment or the like is performed on the single crystal silicon layer so as to repair crystal defects of the single crystal silicon layer serving as a seed layer. The reason of this is as follows: epitaxial growth does not proceed well due to crystal defects which are generated in the single crystal semiconductor layer by a hydrogen ion implantation step or a separation step in a hydrogen ion implantation separation method.

REFERENCE

Patent Document

[Patent Document 1] Japanese Published Patent Application No. 2000-30995
[Patent Document 2] Japanese Published Patent Application No. H11-74209
[Patent Document 3] Japanese Published Patent Application No. 2009-177145

SUMMARY OF THE INVENTION

In the method described in Patent Document 1, the deposition is performed by vapor-phase epitaxial growth, and the deposition rate is difficult to increase above a certain level. This becomes a major problem when mass production of semiconductor devices is considered. The method described in Patent Document 2 cannot be applied to a plastic substrate, a glass substrate, or the like having low heat resistance because heat treatment needs to be performed at high temperature. In the method described in Patent Document 3, laser treatment is needed before epitaxial growth, resulting in increase in manufacturing cost of an SOI substrate.

In view of the foregoing problems, an object is to provide an SOI substrate including a single crystal semiconductor layer with a large thickness by a manufacturing method which is suitable for mass production and which can be applied to a substrate having low heat resistance.

Another object is to provide a method in which, even in the case where crystal defects of a single crystal semiconductor layer serving as a seed layer are not repaired, subsequent epitaxial growth favorably proceeds.

Another object is to provide an SOI substrate in which crystallinity of a single crystal semiconductor layer serving as a seed layer is recovered by solid-phase epitaxial growth even without an addition step of repairing crystal defects of the single crystal semiconductor layer.

In the present invention, an amorphous semiconductor layer is formed over a thin single crystal semiconductor layer included in an SOI substrate, and is made to solid-phase epitaxially grow. The amorphous semiconductor layer is formed by a CVD method at a substrate temperature of higher than or equal to 100° C. and lower than or equal to 275° C. with use of a silane-based gas not diluted.

Note that in this specification, the term "a silane-based gas is not diluted" means that another gas with which the silane-based gas is diluted is not intentionally mixed with the silane-based gas. For example, the case of mixing another gas, such as the case of adding hydrogen or the like together with a silane-based gas to a chamber of a CVD apparatus, is not included in this case. In other words, in this specification, the term "a silane-based gas is not diluted" means that the atmosphere in the chamber contains only a silane-based gas. However, inclusion of another component which cannot be controlled in a silane-based gas, for example, inclusion of another component such as an impurity is not excluded from this case.

In a structure of the present invention, a first single crystal semiconductor layer provided over a glass substrate or a plastic substrate with an insulating layer therebetween is prepared; an amorphous semiconductor layer is formed over the first single crystal semiconductor layer by a CVD method at a deposition temperature of higher than or equal to 100° C. and lower than or equal to 275° C. with use of a silane-based gas not diluted; and heat treatment is performed to make the amorphous semiconductor layer solid-phase epitaxially grow so that a second single crystal semiconductor layer is formed over the first single crystal semiconductor layer.

In another structure of the present invention, a first single crystal semiconductor layer provided over a glass substrate or a plastic substrate with an insulating layer therebetween is prepared; an amorphous semiconductor layer is formed over the first single crystal semiconductor layer by a CVD method at a deposition temperature of higher than or equal to 100° C. and lower than or equal to 275° C. with use of a silane-based gas not diluted; plasma treatment using a rare gas is performed on the amorphous semiconductor layer to planarize the amorphous semiconductor layer; and heat treatment is performed to make the amorphous semiconductor layer solid-phase epitaxially grow so that a second single crystal semiconductor layer is formed over the first single crystal semiconductor layer.

In another structure of the present invention, a first single crystal semiconductor layer provided over a glass substrate or a plastic substrate with an insulating layer therebetween is prepared; an amorphous semiconductor layer is formed over the first single crystal semiconductor layer by a CVD method at a deposition temperature of higher than or equal to 100° C. and lower than or equal to 275° C. with use of a silane-based gas not diluted; heat treatment is performed to make the amorphous semiconductor layer solid-phase epitaxially grow so that a second single crystal semiconductor layer is formed over the first single crystal semiconductor layer; and the second single crystal semiconductor layer is removed.

Note that in this specification, the term "single crystal" means a crystal which has a periodic structure and crystal axes oriented in the same direction in all portions of the crystal surface. However, in this specification, disorder of regularity such as a defect and lattice distortion is not excluded.

In the present invention, in the case where an SOI structure including a single crystal semiconductor layer with a large thickness is formed by a hydrogen ion implantation separation method or the like, it is not necessary to separate a single crystal semiconductor layer thickly from a single crystal semiconductor substrate. Therefore, in the case where the single crystal semiconductor substrate from which the single crystal semiconductor layer has been separated is reused, a single crystal semiconductor layer can be separated thinly from the substrate; thus, the number of times of reusing the substrate can be increased, so that manufacturing cost of an SOI substrate can be reduced.

In the present invention, a solid-phase epitaxial growth technique is used, so that the epitaxial growth rate can be increased as compared with that in the case where vapor-phase epitaxial growth is performed as disclosed in Patent Document 1. Further, since an amorphous semiconductor layer is formed with use of a silane-based gas not diluted, the deposition rate can be increased more than that in a general method in which deposition is performed with use of a silane-based gas diluted with hydrogen. That is, SOI substrates can be manufactured with improved productivity. Further, since the single crystal semiconductor layer can have a large thickness at much lower temperature than that in the method disclosed in Patent Document 2, a substrate having low heat resistance can also be used.

With the use of the above method for forming an amorphous semiconductor layer, solid-phase epitaxial growth can be favorably performed even without a step of repairing defects of a single crystal semiconductor layer serving as a seed layer, such as a laser treatment step. Thus, the present invention can provide an SOI substrate at lower cost than Patent Document 3. In addition, through solid-phase epitaxial growth, crystallinity of a single crystal semiconductor layer serving as a seed layer can also be recovered. Therefore, an SOI substrate including a single crystal semiconductor layer with improved crystallinity can be manufactured.

Another method of the present invention actively uses the fact that the crystallinity of a single crystal semiconductor layer serving as a seed layer is recovered through solid-phase epitaxial growth. That is, an SOI substrate including a thin single crystal semiconductor layer with recovered crystallinity can be manufactured by removal of a layer which has solid-phase epitaxially grown.

BRIEF DESCRIPTION OF THE DRAWINGS

The patent or application file contains at least one drawing executed in color. Copies of the patent or patent application publication with color drawing will be provided by the Office upon request and payment of the necessary fee.

FIGS. 5A to 5D are a STEM photograph of a cross section of an SOI substrate of an embodiment and electron diffraction images thereof.

FIGS. 7A to 7E show a manufacturing process of an SOI substrate of an embodiment.

FIGS. 9A to 9C show a manufacturing process of an SOI substrate of an embodiment.

FIGS. 11A to 11C show the results of Raman spectroscopy of a single crystal semiconductor layer before and after heat treatment and the results of Raman spectroscopy of single crystal semiconductor layers which has epitaxially grown and has not.

DETAILED DESCRIPTION OF THE INVENTION

Figure 1:
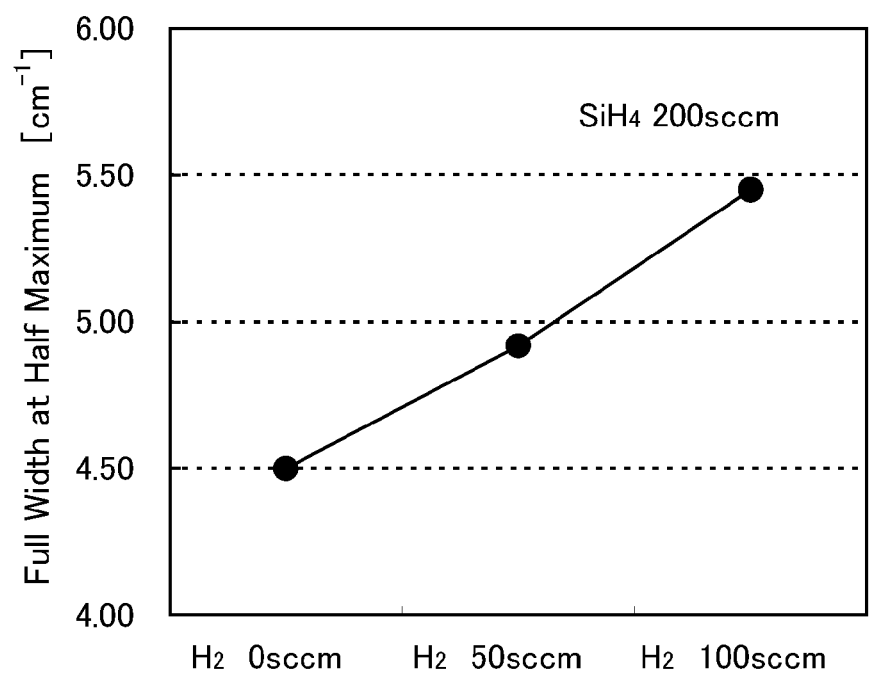
FIG. 1 shows the results of Raman spectroscopy of a single crystal semiconductor layer with respect to the flow rate of hydrogen.

Embodiments and an example of the present inventions will be described below with reference to the accompanying drawings. Note that the present invention is not limited to the following description, and it is easily understood by those skilled in the art that modes and details can be modified in various ways without departing from the purpose and the scope of the present invention. Therefore, the present invention should not be interpreted as being limited to the description of the embodiments below. Note that in the structures of the present invention described below, the same reference numerals are used to define the same components in different drawings.

[Embodiment 1]

FIGS. 7A to 7E show a manufacturing process of this embodiment. First, a supporting substrate 100 is prepared (see FIG. 7A). As the supporting substrate 100, a light-transmitting glass substrate used for a liquid crystal display device or the like can be used. As a glass substrate, a substrate having a strain point of higher than or equal to 580° C. and lower than or equal to 680° C. (preferably, higher than or equal to 600° C. and lower than or equal to 700° C.) is preferably used. Further, it is preferable that the glass substrate be a non-alkali glass substrate. As a material of the non-alkali glass substrate, a glass material such as aluminosilicate glass, aluminoborosilicate glass, or barium borosilicate glass is used, for example.

As the supporting substrate 100, as well as the glass substrate, a substrate which is formed of an insulator, such as a plastic substrate, a ceramic substrate, a quartz substrate, or a sapphire substrate; a substrate formed of a semiconductor such as silicon; a substrate formed of a conductor such as metal or stainless steel; or the like can be used. Note that in the present invention, an SOI substrate is manufactured in such a temperature range as is used also for a supporting substrate having low heat resistance. Therefore, a feature of the present invention is that a glass substrate, a plastic substrate, or the like can be used as the supporting substrate 100.

Although not described in this embodiment, an insulating layer may be formed on a surface of the supporting substrate 100. By provision of the insulating layer, in the case where impurities (such as an alkali metal or an alkaline earth metal) are included in the supporting substrate 100, diffusion of the impurities into a semiconductor layer can be prevented. The insulating layer may have either a single-layer structure or a stacked-layer structure. As a material used for forming the insulating layer, silicon oxide, silicon nitride, silicon oxynitride, silicon nitride oxide, or the like can be given.

In this specification, silicon oxynitride refers to a substance that contains more oxygen than nitrogen and for example, silicon oxynitride includes oxygen, nitrogen, silicon, and hydrogen at concentrations ranging from greater than or equal to 50 atomic % and less than or equal to 70 atomic %, greater than or equal to 0.5 atomic % and less than or equal to 15 atomic %, greater than or equal to 25 atomic % and less than or equal to 35 atomic %, and greater than or equal to 0.1 atomic % and less than or equal to 10 atomic %, respectively. Further, silicon nitride oxide refers to a substance that contains more nitrogen than oxygen and for example, silicon nitride oxide includes oxygen, nitrogen, silicon, and hydrogen at concentrations ranging from greater than or equal to 5 atomic % and less than or equal to 30 atomic %, greater than or equal to 20 atomic % and less than or equal to 55 atomic %, greater than or equal to 25 atomic % and less than or equal to 35 atomic %, and greater than or equal to 10 atomic % and less than or equal to 25 atomic %, respectively. Note that rates of oxygen, nitrogen, silicon, and hydrogen fall within the aforementioned ranges in the cases where measurement is performed using Rutherford backscattering spectrometry (RBS) or hydrogen forward scattering (HFS). In addition, the total of the percentages of the constituent elements does not exceed 100 atomic %.

Next, a single crystal semiconductor substrate 110 is prepared. As the single crystal semiconductor substrate 110, for example, a semiconductor substrate formed using an element belonging to Group 14 of the periodic table, such as silicon, germanium, silicon germanium, or silicon carbide can be used. Needless to say, a substrate formed of a compound semiconductor such as gallium arsenide or indium phosphide may be used. In this embodiment, as the single crystal semiconductor substrate 110, a single crystal silicon substrate is used. Although there is no limitation on the size of the single crystal semiconductor substrate 110, for example, a circular semiconductor substrate having a diameter of 8 inches (200 mm), 12 inches (300 mm), or 18 inches (450 mm) can be processed into a rectangular shape for being used as the single crystal semiconductor substrate 110.

Various kinds of treatment are performed on the single crystal semiconductor substrate 110 to form a damaged region 114 and an insulating layer 116 (see FIG. 7B). The details of the various kinds of treatment will be described later with reference to FIGS. 9A to 9C. Note that the damaged region 114 is a region into which ions are introduced, and the single crystal semiconductor substrate 110 can be split along the region. Thus, the thickness of a single crystal semiconductor layer which is separated from the single crystal semiconductor substrate 110 is determined depending on the depth at which the damaged region 114 is formed. In this embodiment, the damaged region 114 is formed at a depth of greater than or equal to 50 nm and less than or equal to 300 nm from a surface of the single crystal semiconductor substrate 110.

Since the insulating layer 116 is a layer for bonding, the surface thereof preferably has high planarity. As such an insulating layer 116, a silicon oxide film formed by a chemical vapor deposition method using an organosilane gas can be used, for example.

Then, the aforementioned supporting substrate 100 and the single crystal semiconductor substrate 110 are bonded to each other (see FIG. 7C). Specifically, after cleaning the surfaces of the supporting substrate 100 and the insulating layer 116 by a method such as ultrasonic cleaning, the surface of the supporting substrate 100 and the surface of the insulating layer 116 are disposed to be in contact with each other. Then, pressure treatment is performed so that the surface of the supporting substrate 100 and the surface of the insulating layer 116 are bonded to each other. Note that as bonding mechanism, mechanism relating to van der Waals' force, mechanism relating to hydrogen bonding, or the like is conceivable.

Before the bonding step, the surface of the supporting substrate 100 or the surface of the insulating layer 116 may be subjected to oxygen plasma treatment or ozone treatment so as to be hydrophilic. By this treatment, hydroxyl is added to the surface of the supporting substrate 100 or the surface of the insulating layer 116, so that a hydrogen bond can be formed at a bonding interface.

Next, heat treatment is performed on the supporting substrate 100 and the single crystal semiconductor substrate 110 which are bonded to each other, so that bonding force is increased. The heat temperature at this time needs to be a temperature that does not promote separation along the damaged region 114. For example, a temperature lower than 40° C., more preferably lower than or equal to 300° C. can be employed. There is no particular limitation on heat treatment time, and an optimal condition may be set as appropriate in accordance with a relation between processing speed and bonding force. In this embodiment, heat treatment is performed at 200° C. for two hours. Here, only a region for the bonding may be irradiated with a microwave so that the region for the bonding can be locally heated. Note that, in the case where there is no problem with bonding force, the aforementioned heat treatment may be omitted.

Next, the single crystal semiconductor substrate 110 is split into a first single crystal semiconductor layer 120 and a single crystal semiconductor substrate 130 along the damaged region 114 (see FIG. 7D). The single crystal semiconductor substrate 110 is split by heat treatment. The temperature of the heat treatment can be set in consideration of the allowable temperature limit of the supporting substrate 100. For example, when a glass substrate is used as the supporting substrate 100, the temperature of the heat treatment is preferably higher than or equal to 400° C. and lower than or equal to 650° C. Note that heat treatment may also be performed at a temperature of higher than or equal to 400° C. and lower than or equal to 700° C. as long as being performed for a short time. Note that, in this embodiment, heat treatment is performed at 600° C. for two hours.

By the above-described heat treatment, the volume of microvoids formed in the damaged region 114 is changed, whereby a crack is generated in the damaged region 114. As a result, the single crystal semiconductor substrate 110 is split along the damaged region 114. Since the insulating layer 116 is bonded to the supporting substrate 100, the first single crystal semiconductor layer 120 separated from the single crystal semiconductor substrate 110 remains over the supporting substrate 100. Further, since the bonding interface between the insulating layer 116 and the supporting substrate 100 is heated by this heat treatment, a covalent bond is formed at the bonding interface, so that the bonding force between the supporting substrate 100 and the insulating layer 116 is further improved. Note that the single crystal semiconductor substrate 130 which has been separated from the single crystal semiconductor substrate 110 can be reused after a recycling process. The single crystal semiconductor substrate 130 after the recycling process may be used as a substrate from which a single crystal semiconductor layer is obtained for an SOI substrate or may be used for another purpose. In the case where the single crystal semiconductor substrate 130 after the recycling process is used for forming a single crystal semiconductor layer of an SOI substrate, a plurality of SOI substrates can be manufactured from one single crystal semiconductor substrate because a single crystal semiconductor layer may be thinly separated from the substrate in the present invention.

In an SOI substrate formed in the above manner (see FIG. 7E), defects due to the separation step or the ion introduction step exist on a surface of the first single crystal semiconductor layer 120. However, in the present invention, even without treatment such as laser light irradiation for repairing the defects on the surface of the first single crystal semiconductor layer 120, subsequent epitaxial growth can be performed favorably. This point is an important feature of the present invention. Note that the first single crystal semiconductor layer 120 in the state of FIG. 7E is also referred to as a single crystal semiconductor layer after being transferred.

In this manner, the SOI substrate having the first single crystal semiconductor layer 120 formed by being separated from the single crystal semiconductor substrate 110 can be manufactured (see FIG. 7E).

Figure 8A:
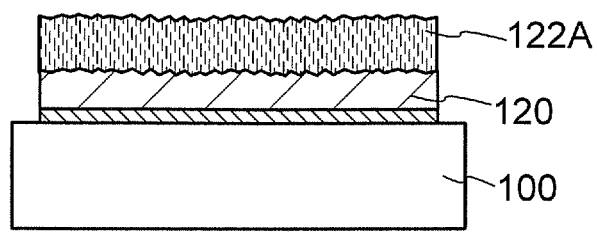
FIGS. 8A and 8B show a manufacturing process of an SOI substrate of an embodiment.

Next, a first amorphous semiconductor layer 122A is formed over the first single crystal semiconductor layer 120 (see FIG. 8A). Here, the first amorphous semiconductor layer 122A may be formed by selecting a material in accordance with the first single crystal semiconductor layer 120. The first amorphous semiconductor layer 122A is an amorphous silicon layer because the first single crystal semiconductor layer 120 is a single crystal silicon layer. In the case where the first single crystal semiconductor layer 120 is a germanium layer, a silicon germanium layer, or a silicon carbide layer, the first amorphous semiconductor layer 122A is an amorphous germanium layer, an amorphous silicon germanium layer, or an amorphous silicon carbide layer, respectively.

Figure 8B:
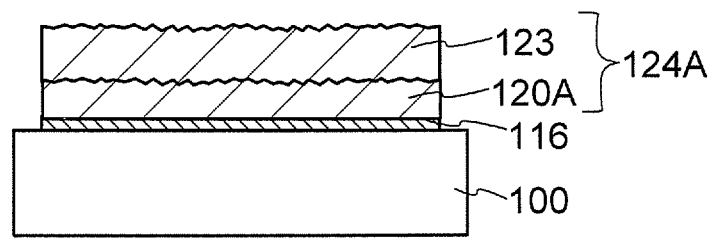

Next, heat treatment is performed, so that the first amorphous semiconductor layer 122A is made to solid-phase epitaxially grow with the use of the first single crystal semiconductor layer 120 as a seed layer. In this manner, a second single crystal semiconductor layer 124A having a large thickness is formed (see FIG. 8B).

As disclosed in Patent Document 3, in the case where the first single crystal semiconductor layer 120 obtained by a hydrogen ion implantation separation method is made to epitaxially grow, conventionally, epitaxial growth proceeds only on the single crystal semiconductor layer crystal defects of which have been repaired.

Thus, the present inventors have examined a method for forming an amorphous semiconductor film which is made to solid-phase epitaxially grow on a single crystal semiconductor layer and succeeded in promoting solid-phase epitaxial growth even in the case where crystal defects of the single crystal semiconductor layer are not repaired.

First, the present inventors focused on a reaction gas used for forming the first amorphous semiconductor layer 122A over the first single crystal semiconductor layer 120 by CVD. Generally, in the case where the first amorphous semiconductor layer 122A is formed using an amorphous silicon film, a silane-based gas diluted with hydrogen is used for the deposition. This is for etching an unstable Si—H bond with use of hydrogen radicals to form an amorphous silicon film with high quality, and for performing subsequent epitaxial growth favorably.

Thus, the present inventors tried to lower the dilution ratio of hydrogen to a silane-based gas intentionally. Specifically, for formation of an amorphous silicon film, the flow rate of silane was fixed at 200 sccm, while the flow rate of hydrogen was changed as follows: 0 sccm, 50 sccm, and 100 sccm. As a result, solid-phase epitaxial growth proceeded favorably on the amorphous silicon film formed with use of a silane-based gas not diluted with hydrogen. The results are shown in FIG. 1. The vertical axis represents the full width at half maximum of the results of Raman spectroscopy of a single crystal semiconductor layer which is formed through solid-phase epitaxial growth (corresponding to the second single crystal semiconductor layer 124A). It is found that the smaller the full width at half maximum is, the more favorable crystallinity becomes. From FIG. 1, the smaller the flow rate of hydrogen is, the more improved crystallinity is.

Figure 2:
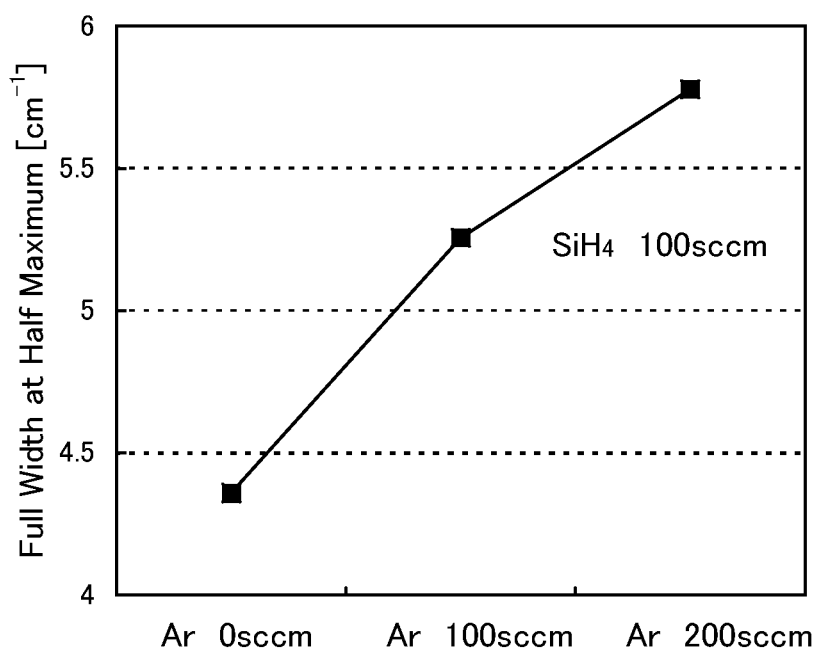
FIG. 2 shows the results of Raman spectroscopy of a single crystal semiconductor layer with respect to the flow rate of argon.

In addition, the case where argon is added to a reaction gas used for forming the amorphous silicon film was examined. The results are shown in FIG. 2. FIG. 2 shows the experimental results in the case where the flow rate of silane was 100 sccm and the flow rate of argon was changed as follows: 0 sccm, 100 sccm, and 200 sccm. The vertical axis represents the full width at half maximum of the results of Raman spectroscopy of a single crystal semiconductor layer which is formed through solid-phase epitaxial growth (corresponding to the second single crystal semiconductor layer 124A). Also from these results, the smaller the flow rate of argon is, the more improved crystallinity is.

From the above results, it was found that the second single crystal semiconductor layer 124A with favorable crystallinity could be obtained by formation of the first amorphous semiconductor layer 122A with use of a 100% silane-based gas which was not diluted as a reaction gas of CVD. This method is entirely different from a conventional method in which a Si—H bond in an amorphous silicon film is removed by deposition with a silane-based gas diluted with hydrogen.

The reason why solid-phase epitaxial growth favorably proceeded on the amorphous silicon film deposited with the silane-based gas not diluted with hydrogen can be thought as follows. With the silane-based gas not diluted with hydrogen, a Si—H bond was actively included in the amorphous silicon film. Then, through heat treatment for solid-phase epitaxial growth, the Si—H bond was cleaved and hydrogen in the amorphous silicon film was eliminated, so that rearrangement of a Si—Si bond was promoted. Therefore, solid-phase epitaxial growth favorably proceeded even on the single crystal semiconductor layer 120 crystal defects of which have not been repaired.

Figure 3:
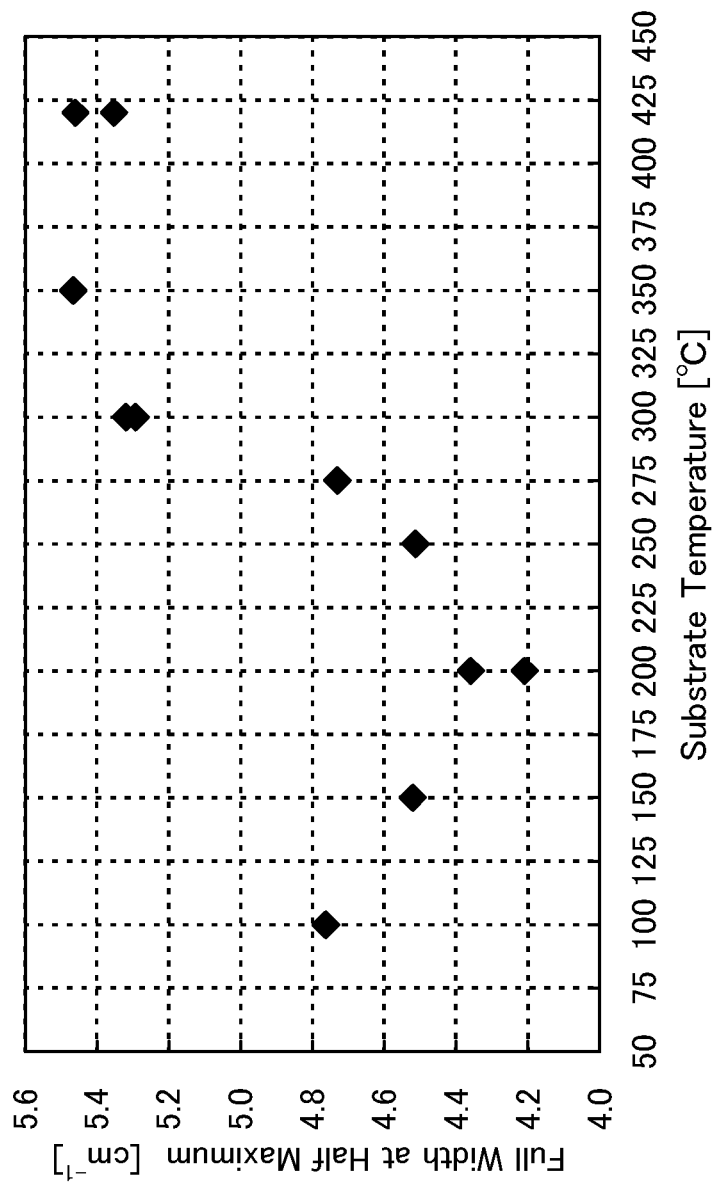
FIG. 3 shows the results of Raman spectroscopy of a single crystal semiconductor layer with respect to the substrate temperature in deposition of amorphous silicon.

Next, the present inventors focused on the substrate temperature at the time of forming the first amorphous semiconductor layer 122A by CVD (the substrate temperature is also referred to as the deposition temperature). FIG. 3 shows the substrate temperatures at the time of forming an amorphous silicon film as the first amorphous semiconductor layer 122A by CVD. The amorphous silicon film was formed with a monosilane gas which was not diluted. The vertical axis represents the full width at half maximum of the results of Raman spectroscopy of a single crystal semiconductor layer which was formed through solid-phase epitaxial growth (corresponding to the second single crystal semiconductor layer 124A) in the case where the first amorphous semiconductor layer 122A was formed using an amorphous silicon film at the respective substrate temperatures. At a substrate temperature in the range of 100° C. to 275° C., crystallinity is relatively high at a full width at half maximum of 4.8 $cm^{-1}$ or less, while at a substrate temperature in the range of 300° C. or higher, crystallinity is relatively low at a full width at half maximum of 5.2 $cm^{-1}$ or more. The reason of this can be thought as follows: when the substrate temperature increases to some extent, a portion where vapor-phase epitaxial growth proceeds is generated in accordance with deposition of the amorphous silicon, so that a single crystal is difficult to generate in later heat treatment. Alternatively, the reason of this can be thought as follows: the lower the substrate temperature is, the larger the flow rate of hydrogen included in the amorphous silicon film becomes, so that the flow rate of hydrogen in the amorphous silicon film formed at a substrate temperature of 275° C. or lower is suitable for solid-phase epitaxial growth. Accordingly, FIG. 3 shows that an amorphous silicon film which is formed at a substrate temperature of higher than or equal to 100° C. and lower than or equal to 275° C., at which a single crystal semiconductor layer having a full width at half maximum of 4.8 $cm^{-1}$ or less is obtained, is suitable for promoting solid-phase epitaxial growth on an amorphous silicon film. It is found that a more suitable amorphous silicon film is formed at a substrate temperature of higher than or equal to 150° C. and lower than or equal to 250° C., at which a single crystal semiconductor layer having a full width at half maximum of 4.6 $cm^{-1}$ or less is obtained.

Note that in the case where deposition is performed at a substrate temperature of lower than 100° C., film quality is extremely low and the temperature in this range is unsuitable for epitaxial growth. In the case where deposition is performed at a substrate temperature of 300° C. or higher, a portion on which vapor-phase epitaxial growth proceeds is generated at the same time as the deposition of the amorphous silicon, so the temperature in this range is unsuitable for solid-phase epitaxial growth.

As described above, when the first amorphous semiconductor layer 122A is formed by CVD at a substrate temperature (a deposition temperature) of higher than or equal to 100° C. and lower than or equal to 275° C., especially higher than or equal to 150° C. and lower than or equal to 250° C., favorable solid-phase epitaxial growth can be achieved. With the use of this deposition method, solid-phase epitaxial growth can favorably proceed on the first single crystal semiconductor layer 120 even when crystal defects of the first single crystal semiconductor layer 120 serving as a seed layer are not repaired. Note that the substrate temperature in this specification may be referred to as the deposition temperature.

By the above method, an SOI substrate including a single crystal semiconductor layer whose thickness becomes large due to a solid-phase epitaxial method can be manufactured even if crystal defects of the single crystal semiconductor layer serving as a seed layer are not repaired.

One important feature of the present invention is a deposition method of the first amorphous semiconductor layer 122A. As described above, the first amorphous semiconductor layer 122A is formed by a plasma CVD method with use of a 100% silane-based gas (typically, a monosilane gas) which is not diluted with hydrogen or another gas. The substrate temperature at this time is higher than or equal to 100° C. and lower than or equal to 275° C., preferably higher than or equal to 150° C. and lower than or equal to 250° C. By formation of the first amorphous semiconductor layer 122A by the above deposition method, even when crystal defects of the first single crystal semiconductor layer 120 are not repaired by laser light irradiation or the like, solid-phase epitaxial growth can be favorably performed later.

Note that the silane-based gas is not limited to the aforementioned monosilane gas, and a disilane ($Si_2H_6$) gas or the like may be used. When the silane-based gas is diluted with hydrogen, hydrogen atoms bonded to silicon are more likely to be eliminated, so that the amount of hydrogen in the amorphous silicon film becomes small. Therefore, with the silane-based gas not diluted with hydrogen or another gas, hydrogen can be contained in the amorphous silicon film. In addition, due to hydrogen contained in the amorphous silicon film, rearrangement of Si at the time of solid-phase epitaxial growth can smoothly proceed.

Figure 4:
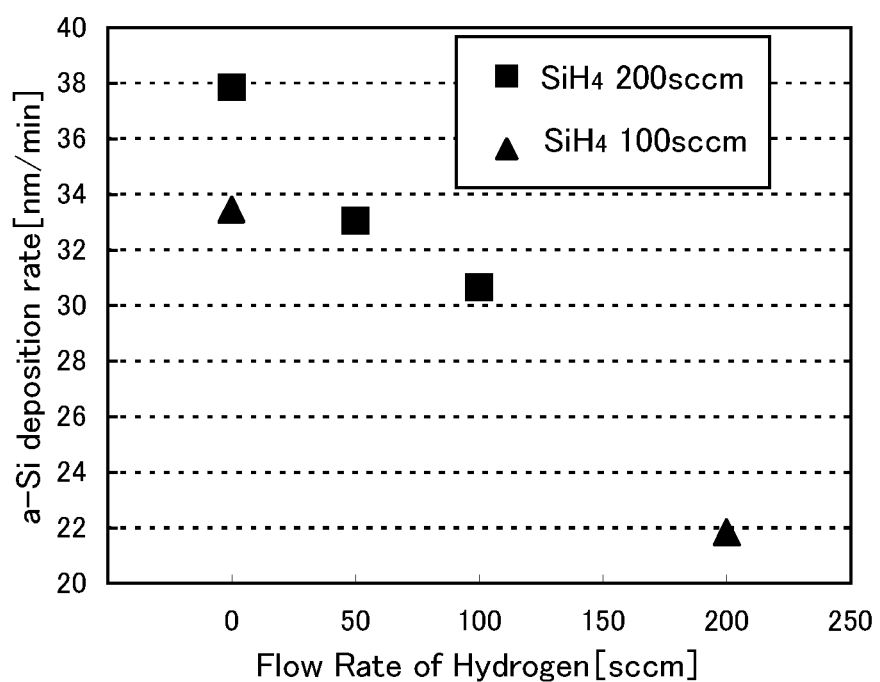
FIG. 4 shows the deposition rate of a-Si with respect to the flow rate of hydrogen.

When the silane gas is not diluted, the deposition rate of the amorphous semiconductor layer can be increased as compared with that in the case where the silane gas is diluted with hydrogen. FIG. 4 is a graph showing the deposition rate in the case where an amorphous silicon film was formed to a thickness of 100 nm at a substrate temperature of 250° C. The flow rate of silane was set to 100 sccm and 200 sccm. As seen from FIG. 4, the deposition rate is the highest when the flow rate of hydrogen is 0. From this point, according to the present invention, SOI substrates can be manufactured with improved productivity.

Other conditions in the case where the first amorphous semiconductor layer 122A is formed by a plasma CVD method are as follows: the frequency is 27 MHz; the electric power is greater than or equal to 30 W and less than or equal to 100 W; the pressure in the chamber is 35 Pa; and the distance between electrodes (in the case of a parallel-plate type) is 25 mm. The above-mentioned deposition conditions are merely an example, and this embodiment should not be construed as being limited to this example.

Note that a natural oxide layer formed on a surface of the first single crystal semiconductor layer 120 and the like are preferably removed before the epitaxial growth of the first amorphous semiconductor layer 122A. This is because when an oxide layer is formed on the surface of the first single crystal semiconductor layer 120, the epitaxial growth which is influenced by the crystallinity of the first single crystal semiconductor layer 120 cannot be advanced and the crystallinity of the second single crystal semiconductor layer 124A is lowered. Here, the oxide layer can be removed using a solution containing a fluorinated acid, hydrogen plasma, or the like.

After that, heat treatment at 500° C. for one hour and heat treatment at 550° C. for four hours were sequentially performed using a heating furnace. Accordingly, the first amorphous semiconductor layer 122A solid-phase epitaxially grows, and the second single crystal semiconductor layer 124A having a large thickness is formed (see FIG. 8B). At this time, the first single crystal semiconductor layer 120 serves as a seed crystal, so that the first amorphous semiconductor layer 122A provided over the first single crystal semiconductor layer 120 can be single-crystallized. The second single crystal semiconductor layer 124A is formed of a fourth single crystal semiconductor layer 120A and a third single crystal semiconductor layer 123 which is formed through solid-phase epitaxial growth. In some cases, the interface between the third single crystal semiconductor layer 123 and the fourth single crystal semiconductor layer 120A was identified; in other cases, recrystallization was smoothly performed so that the interface therebetween was difficult to identify because the optimal formation method was selected.

Through the heat treatment for epitaxial growth, the film quality of the first single crystal semiconductor layer 120 was also improved, so that the fourth single crystal semiconductor layer 120A with improved crystallinity was formed. This point will be described in Embodiment 2 in detail.

Figure 15:
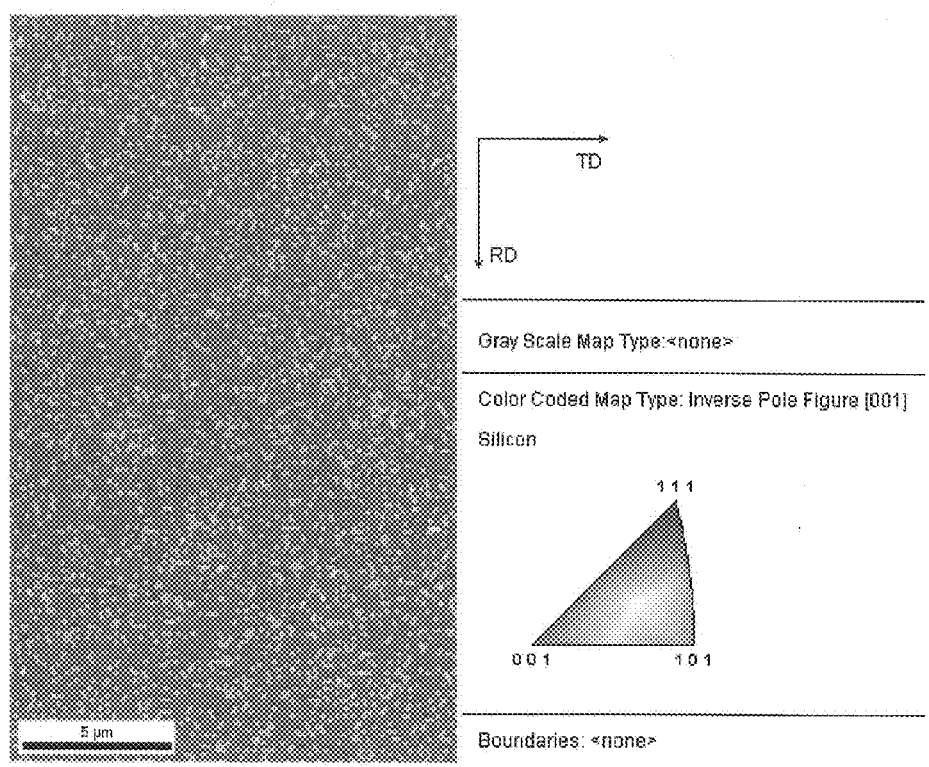
FIG. 15 shows the results of EBSP measurement of a single crystal semiconductor layer of an embodiment.

FIG. 5A shows a cross-sectional STEM image of an SOI substrate in which an amorphous silicon film deposited at a substrate temperature of 200° C. was made to solid-phase epitaxially grow. A base film, a single crystal silicon layer, and a solid-phase epitaxial layer were formed over a glass substrate in this order, and a C evaporation film, a Pt film, and a C film were provided thereover for the analysis. Electron diffraction images of portions 1, 2, and 3 in the single crystal silicon layer and the epitaxial layer are shown in FIGS. 5B, 5C, and 5D, respectively. As a result, it was confirmed that the three portions each had crystallinity. Further, when an electron backscatter diffraction pattern (EBSP) was measured, the crystal orientation of the epitaxial layer was almost (100) and was almost the same as the crystal orientation of the single crystal silicon layer serving as a seed crystal. The results are shown in FIG. 15.

The above-mentioned heat treatment for the solid-phase epitaxial growth can be performed using a heat treatment apparatus such as a rapid thermal annealing (RTA) apparatus, a furnace, a millimeter wave heating apparatus, or the like. As a heating method of the heat treatment apparatus, a resistance heating method, a lamp heating method, a gas heating method, an electromagnetic heating method, or the like can be given. The heat treatment may be performed by laser light irradiation or thermal plasma jet irradiation.

In general, a furnace is an external heating method, and the inside of the chamber and a process object are in thermal equilibrium. On the other hand, an RTA apparatus is an apparatus for performing instantaneous heating (rapid heating) by directly giving energy to a process object, and the inside of the chamber and the process object are in thermal nonequilibrium. As the RTA apparatus, an RTA apparatus by a lamp heating method (a lamp rapid thermal annealing (LRTA) apparatus), an RTA apparatus by a gas heating method using a heated gas (a gas rapid thermal annealing (GRTA) apparatus), an RTA apparatus by both a lamp heating method and a gas heating method, or the like can be given. When an RTA apparatus is used, it is preferable that the treating temperature be 500° C. to 750° C. and the treating time be 0.5 minute to 10 minutes.

Figure 6:
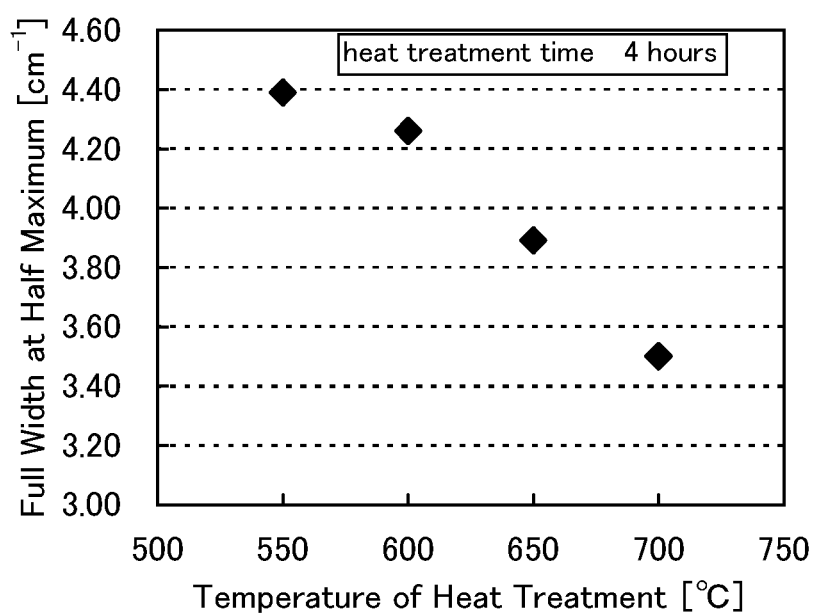
FIG. 6 shows the results of Raman spectroscopy of a single crystal semiconductor layer with respect to the temperature of heat treatment.

When a furnace is used, it is preferable that the treating temperature be 550° C. or higher. FIG. 6 shows the results of Raman spectroscopy of an amorphous silicon film which was deposited at a substrate temperature of 200° C. and then was subjected to heat treatment at the respective temperatures for four hours as heat treatment for solid-phase epitaxial growth. When the heat treatment was performed at 500° C. for four hours, crystallinity of the amorphous silicon film was not observed, which shows that solid-phase epitaxial growth did not proceed at this temperature. On the other hand, when the heat treatment was performed at 550° C. or higher, crystallinity of the amorphous silicon film was observed, which shows that solid-phase epitaxial growth proceeded in this temperature range. The higher the temperature of heat treatment was, the more improved the crystallinity became. Therefore, the upper temperature limit of the heat treatment may be equal to the allowable temperature limit of the supporting substrate 100 in the SOI substrate.

In the above manner, an SOI substrate including a thick single crystal semiconductor layer can be manufactured. In the present invention, solid-phase epitaxial growth can be made to proceed at a much lower temperature than that in conventional solid-phase epitaxial growth disclosed in Patent Document 2. This is due to the formation method of the amorphous semiconductor layer which is made to solid-phase epitaxially grow. Since the amorphous semiconductor layer is made to contain a large amount of hydrogen which is to be released during the solid-phase epitaxial growth, rearrangement of a silicon bond is promoted; thus, the solid-phase epitaxial growth proceeds even through low-temperature heat treatment. Therefore, in the present invention, a glass substrate or a plastic substrate having low heat resistance can also be used as the supporting substrate 100, the manufacturing cost of an SOI substrate can be reduced and a large-sized SOI substrate can be manufactured.

After that, planarization treatment is performed on a surface of the second single crystal semiconductor layer 124A. As the planarization treatment, etching treatment such as dry etching or wet etching, polishing treatment such as chemical mechanical polishing (CMP), plasma treatment, or the like can be given. In the case where plasma treatment is employed, a rare gas may be used.

As another example of the planarization treatment, after the first amorphous semiconductor layer 122A in FIG. 8A is formed, plasma treatment using a rare gas may be performed in order to planarize a surface of the first amorphous semiconductor layer 122A. Then, the first amorphous semiconductor layer 122A on which plasma treatment is performed is made to solid-phase epitaxially grow, so that the second single crystal semiconductor layer 124A having a plane surface can be obtained. While the average surface roughness (Ra) of the second single crystal semiconductor layer 124A on which plasma treatment is not performed is 7 nm to 8 nm, the average surface roughness of the second single crystal semiconductor layer 124A can be reduced to about half or less, 3 nm to 4 nm in the case where plasma treatment is performed with use of argon as a rare gas. Further, when etch-back treatment using a $NF_3$ gas or the like is performed after the plasma treatment, impurities entering the first amorphous semiconductor layer 122A during the plasma treatment can be removed.

Here, favorable results are obtained not in the case where the first amorphous semiconductor layer 122A is planarized before deposition, that is, in the case where the surface of the first single crystal semiconductor layer 120 in the state of FIG. 7E is planarized, but in the case where the first amorphous semiconductor layer 122A is planarized through plasma treatment using a rare gas after deposition. This will be described in Example 1.

Conventionally, the first single crystal semiconductor layer 120 after being transferred in the state of FIG. 7E is irradiated with a laser beam to be partially melted, so that the first single crystal semiconductor layer 120 is recrystallized and surface roughness is reduced. However, due to laser irradiation, pitch stripes are generated. On the other hand, when planarization is performed through plasma treatment using a rare gas, this problem can be prevented. Further, since an object on which plasma treatment using a rare gas is performed is an amorphous semiconductor layer, a problem of reduction in crystallinity due to plasma damage does not arise, and in addition, single crystallization can be performed through solid-phase epitaxial growth that will be performed later.

Note that in the case where planarization is insufficient even after plasma treatment is performed using a rare gas for improving planarity and the second single crystal semiconductor layer 124A is obtained, etching treatment such as dry etching or wet etching or polishing treatment such as CMP may be performed.

Next, a processing method of the single crystal semiconductor substrate 110 used in this embodiment is described with reference to FIGS. 9A to 9C.

First, the single crystal semiconductor substrate 110 is prepared (see FIG. 9A). As for the detail of the single crystal semiconductor substrate 110, the description with reference to FIGS. 7A to 7E can be referred to; therefore, the detail of the single crystal semiconductor substrate 110 is omitted here.

After the single crystal semiconductor substrate 110 is cleaned, an insulating layer 112 is formed on the surface of the single crystal semiconductor substrate 110. A structure without providing the insulating layer 112 may be employed; however, it is preferable to provide the insulating layer 112 so that the single crystal semiconductor substrate 100 is prevented from being contaminated and the surface of the single crystal semiconductor substrate 100 is prevented from being damaged in later ion introduction. The thickness of the insulating layer 112 is preferably greater than or equal to 10 nm and less than or equal to 400 nm.

As a material for the insulating layer 112, silicon oxide, silicon nitride, silicon oxynitride, silicon nitride oxide, or the like can be used. The insulating layer 112 can be formed by a CVD method, a sputtering method, a method using oxidation (or nitridation) of the single crystal semiconductor substrate 110, or the like.

Next, the single crystal semiconductor substrate 110 is irradiated with an ion beam 140 including ions accelerated by an electric field through the insulating layer 112, so that the damaged region 114 is formed in a region at a predetermined depth from the surface of the single crystal semiconductor substrate 110 (see FIG. 9B). The depth of the region where the damaged region 114 is formed can be controlled by acceleration energy and incident angle of the ion beam 140. The damaged region 114 is formed at a depth the same or substantially the same as the average penetration depth of the ions.

Depending on the depth at which the damaged region 114 is formed, the thickness of the single crystal semiconductor layer which is separated from the single crystal semiconductor substrate 110 is determined. The depth at which the damaged region 114 is formed is less than or equal to 500 nm, preferably less than or equal to 400 nm, and more preferably greater than or equal to 50 nm and less than or equal to 300 nm from the surface of the single crystal semiconductor substrate 110. By formation of the damaged region 114 at a shallow depth, the single crystal semiconductor substrate remains thick after the separation; therefore, the number of times of reusing the single crystal semiconductor substrate can be increased. Note that in the case where the damaged region 114 is formed at a shallow depth, accelerating voltage is set to be low; therefore, productivity or the like needs to be considered.

The aforementioned ion irradiation can be performed with use of an ion doping apparatus or an ion implantation apparatus. In an ion implantation apparatus, a source gas is excited to produce ion species, the produced ion species are mass-separated, and the ion species having a predetermined mass are introduced into a process object. In an ion doping apparatus, a process gas is excited to produce ion species and ion species which are not mass-separated are introduced into a process object. Note that in an ion doping apparatus provided with a mass separator, ion implantation with mass separation can be performed as in the ion implantation apparatus.

The ion irradiation step in the case of using an ion doping apparatus can be performed in the following manner, for example.

Accelerating voltage is greater than or equal to 10 kV and less than or equal to 100 kV (preferably greater than or equal to 30 kV and less than or equal to 80 kV)

Dose is greater than or equal to $1\times10^{16}/cm^2$ and less than or equal to $4\times10^{16}/cm^2$.

Beam current density is greater than or equal to 2 µA/cm² (preferably greater than or equal to 5 µA/cm², more preferably greater than or equal to 10 µA/cm²)

In the case of using an ion doping apparatus, a gas containing hydrogen can be used as a source gas for an ion irradiation step. With the gas containing hydrogen, $H^+$, $H_2^+$, and $H_3^+$ can be produced as ion species. In the case where a hydrogen gas is used as a source gas, it is preferable to perform irradiation with a large amount of $H_3^+$ ions. Specifically, for example, it is preferable that the ion beam 140 contain $H_3^+$ ions at a proportion of 70% or higher with respect to the total number of $H^+$, $H_2^+$, and $H_3^+$ ions. It is more preferable that the proportion of $H_3^+$ ions be higher than or equal to 80%. With a high proportion of $H_3^+$ in this manner, the damaged region 114 can contain hydrogen at a concentration of $1\times10^{20}$ atoms/cm³ or higher. Accordingly, separation at the damaged region 114 can be performed easily. When a large amount of $H_3^+$ is used, introduction efficiency with ions is increased in comparison with the case where $H^+$ and $H_2^+$ are used. In other words, time required for ion introduction can be shortened. Note that although the case of using a large amount of $H_3^+$ ions is described here, there is no problem even when the proportion of $H^+$ ions and $H_2^+$ ions is increased.

When the ion implantation apparatus is used, it is preferable to implant $H_3^+$ ions through mass separation. Of course, $H^+$ ions or $H_2^+$ ions may be implanted. Note that, in the case of using an ion implantation apparatus, efficiency of the ion introduction may be reduced compared to the case of using an ion doping apparatus. This is because ion species are selectively implanted.

As a source gas for the ion irradiation step, one or more kinds of gases selected from a rare gas such as helium or argon; a halogen gas typified by a fluorine gas or a chlorine gas; or a halogen compound gas such as a fluorine compound gas (e.g., $BF_3$) can also be used. When helium is used for a source gas, the ion beam 140 with a high proportion of $He^+$ ions can be formed without mass separation. With use of such an ion beam 140, the damaged region 114 can be efficiently formed.

Further, an ion irradiation step may be performed plural times to form the damaged region 114. In this case, the same source gas may be used in all ion irradiation steps or a different source gas may be used for each ion irradiation step. For example, ion irradiation can be performed using a gas containing hydrogen as a source gas after ion irradiation is performed using a rare gas as a source gas. Alternatively, first, ion irradiation can be performed using a halogen gas or a halogen compound gas, and then, ion irradiation can be performed using a gas containing hydrogen.

After the damaged region 114 is formed, the insulating layer 112 is removed and the insulating layer 116 is formed (see FIG. 9C). Since the insulating layer 116 is a layer to be bonded, the surface thereof preferably has high planarity. As such an insulating layer 116, a silicon oxide layer formed by a chemical vapor deposition method using an organosilane gas can be used, for example. Alternatively, a silicon nitride layer may be used.

Here, the insulating layer 112 is removed because there is a high possibility that the insulating layer 112 may be damaged by the ion irradiation. Therefore, in the case where damage to the insulating layer 112 due to the ion irradiation does not become a problem, the insulating layer 116 may be formed over the insulating layer 112. Alternatively, the insulating layer 112 can also be used as the insulating layer 116.

In this manner, the semiconductor substrate illustrated in FIG. 7B can be obtained. Note that this embodiment can be implemented in combination with any of the other embodiments as appropriate.

[Embodiment 2]

It was found that, in addition to the first amorphous semiconductor layer 122A in FIG. 8A, the first single crystal semiconductor layer 120 provided therebelow had improved crystallinity through solid-phase epitaxial growth by the method described in Embodiment 1. Thus, in this embodiment, a single crystal semiconductor layer whose crystallinity is improved by epitaxial growth is actively used. That is, a mode where a layer is made to solid-phase epitaxially grow and then is subjected to etch-back treatment with which the thickness of the layer is more reduced by etching than the thickness obtained through the epitaxial growth will be described. Note that the same portions as those in the above-described drawings are denoted by the same reference numerals and the description thereof is omitted.

First, crystallinity of a single crystal semiconductor layer in the case where heat treatment was only performed on an SOI substrate without solid-phase epitaxial growth was confirmed. An SOI substrate in the state of FIG. 7E (the one in which the first single crystal semiconductor layer 120 was transferred onto the supporting substrate 100 with the insulating layer 116 therebetween) was used, and was subjected to heat treatment at 500° C. for one hour and then at 550° C. for four hours, and crystallinity of the first single crystal semiconductor layer 120 before and after the heat treatment was confirmed. FIG. 11A shows the results of Raman spectroscopy. There was not a difference between the full width at half maximum of the first single crystal semiconductor layer 120 before the heat treatment and that after the heat treatment, which shows that crystallinity of the single crystal silicon layer was not improved.

Next, crystallinity of Comparative Example 1 which was formed in such a manner that an SOI substrate in the state of FIG. 7E was subjected to heat treatment at 500° C. for one hour and then was subjected to heat treatment at 550° C. for four hours, and crystallinity of Sample A which was formed in such a manner that an SOI substrate in the state of FIG. 8A (the first amorphous semiconductor layer was formed by the method described in Embodiment 1) was subjected to heat treatment at 500° C. for one hour and then was subjected to heat treatment at 550° C. for four hours to solid-phase epitaxially grow, were measured by Raman spectroscopy. In Sample A, the first amorphous semiconductor layer 122A was formed at a substrate temperature of 250° C. FIGS. 11B and 11C show the results of Raman spectroscopy. FIG. 11B shows the Raman spectra and FIG. 11C shows the full widths at half maximum of the Raman spectra of FIG. 11B. The Raman spectra of Sample A and Comparative Example 1 each have peaks at around 482 cm$^{-1}$ and 520 cm$^{-1}$, and the former is a peak of a Raman spectrum of fluorescent light and the latter is a peak of a Raman spectrum of silicon.

It can be seen from FIGS. 11B and 11C that Sample A which has solid-phase epitaxially grown has a smaller full width at half maximum and higher crystallinity than Comparative Example 1. Note that the results of Raman spectroscopy of Sample A are the measurement results of a layer which has epitaxially grown and a single crystal semiconductor layer provided therebelow. According to the measurement results, crystallinity was not recovered in the case where the single crystal semiconductor layer after being transferred was only subjected to heat treatment; however, through solid-phase epitaxial growth, the single crystal semiconductor layer which was the transferred lower layer also had improved crystallinity. Note that the crystallinity measured by the results of Raman spectroscopy is not based on the Raman spectrum intensity but based on the full width at half maximum. This is because the Raman spectrum intensity is changed depending on film thickness, unevenness of a surface of a film, or the like.

Figure 10A:
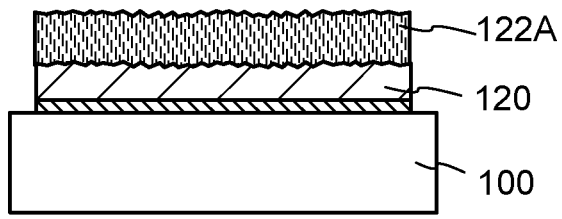
FIGS. 10A to 10C show a manufacturing process of an SOI substrate of an embodiment.

On the basis of these results, a method for manufacturing an SOI substrate according to this embodiment will be described with reference to FIGS. 10A to 10C. A process in which the supporting substrate and the single crystal semiconductor substrate are attached and the single crystal semiconductor layer is separated is performed in the same manner as FIGS. 7A to 7E in Embodiment 1. Then, in the same manner as FIG. 8A, the first amorphous semiconductor layer 122A is formed over the first single crystal semiconductor layer 120 (see FIG. 10A).

Figure 10B:
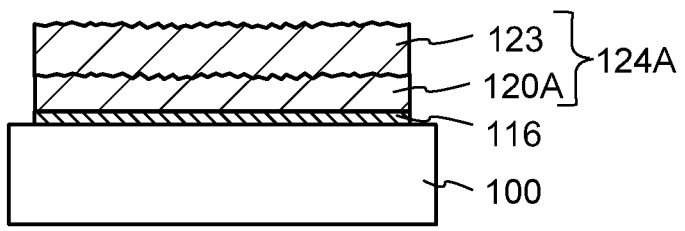

Next, through heat treatment, the first amorphous semiconductor layer 122A is made to solid-phase epitaxially grow, so that the third single crystal semiconductor layer 123 is formed (see FIG. 10B). At this time, through solid-phase epitaxial growth, crystallinity of the first single crystal semiconductor layer 120 is also improved, so that the fourth single crystal semiconductor layer 120A is formed. That is, the second single crystal semiconductor layer 124A is formed of the third single crystal semiconductor layer 123 and the fourth single crystal semiconductor layer 120A. The interface between the fourth single crystal semiconductor layer 120A and the third single crystal semiconductor layer 123 is identified in some cases, while recrystallization of the third single crystal semiconductor layer 123 is favorably performed so that the interface therebetween cannot be identified in other cases.

Figure 12:
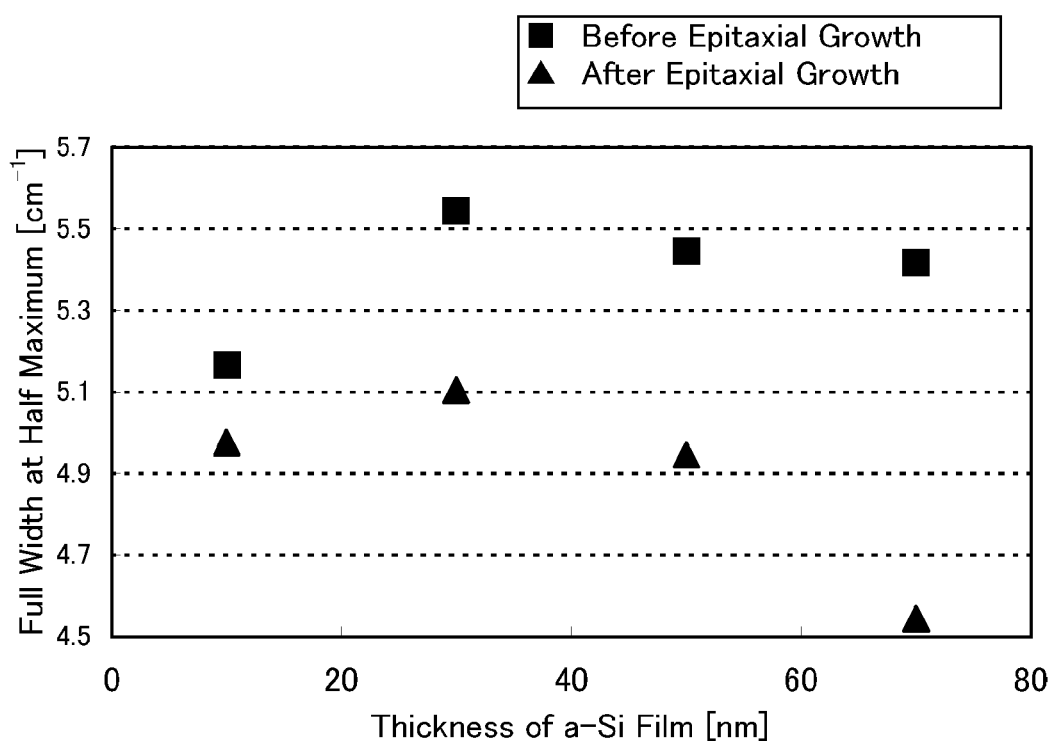
FIG. 12 shows the results of Raman spectroscopy of a single crystal semiconductor layer with respect to the thickness of an a-Si film.

Even in the case where the first amorphous semiconductor layer 122A has a small thickness, improvement in crystallinity of the first single crystal semiconductor layer 120 therebelow is not influenced. FIG. 12 shows the results of Raman spectroscopy in the case where the thickness of the first amorphous semiconductor layer 122A is changed. Even when the first amorphous semiconductor layer 122A has a small thickness of 10 nm, the full width at half maximum of the second single crystal semiconductor layer 124A becomes small after the heat treatment for solid-phase epitaxial growth. This shows that the crystallinity is improved.

Figure 10C:
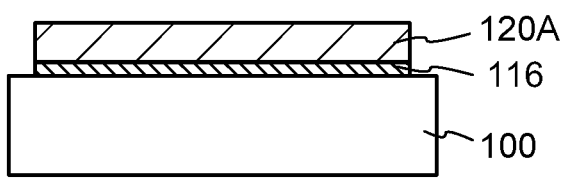

Next, etch-back treatment is performed so that at least the third single crystal semiconductor layer 123 is removed (FIG. 10C). As the etch-back treatment, either wet etching or dry etching may be employed. In the case of dry etching, plasma etching with use of NF$_3$ may be performed. By removal of the third single crystal semiconductor layer 123, influences of deposition of the first amorphous semiconductor layer 122A and heat treatment for solid-phase epitaxial growth on a device can be reduced even in the case where impurities enter the first amorphous semiconductor layer 122A. Since the interface between the fourth single crystal semiconductor layer 120A and the third single crystal semiconductor layer 123 is not formed, transistor characteristics can be improved in the case where a transistor is formed using an SOI substrate manufactured according to this embodiment.

Etch-back treatment may also serve as planarization treatment for a surface of the fourth single crystal semiconductor layer 120A. Accordingly, the number of manufacturing steps is not increased, and manufacturing cost is not increased. As the planarization treatment, plasma treatment with use of a rare gas may be performed on the first amorphous semiconductor layer 122A as described in Embodiment 1.

With the use of the method for manufacturing an SOI substrate of this embodiment, crystallinity of the first single crystal semiconductor layer 120 after being transferred which has defects can be improved without treatment for repairing the defects such as laser treatment. The first amorphous semiconductor layer 122A which is made to solid-phase epitaxially grow is finally removed, so that it is not necessary to improve film quality of the first amorphous semiconductor layer 122A itself. Further, it is not necessary to set deposition conditions finely for improving reproducibility. That is, the film quality of the first amorphous semiconductor layer 122A in this embodiment may have a certain range, so that SOI substrates can be manufactured with improved productivity. Further, according to this embodiment, defects of the single crystal semiconductor layer after being transferred can be repaired at lower cost with higher productivity than those in the case where laser treatment is employed.

This embodiment can be implemented in combination with the above embodiment.

[Embodiment 3]

In this embodiment, a method for manufacturing an n-channel thin film transistor and a p-channel thin film transistor with use of an SOI substrate manufactured according to any of the above embodiments will be described with reference to FIGS. 13A to 13D and FIGS. 14A to 14C. Various kinds of semiconductor devices can be formed by combining a plurality of thin film transistors (TFTs). Note that the same portions as those in the above-described drawings are denoted by the same reference numerals and the description thereof is omitted.

The case where an SOI substrate manufactured by the method described in Embodiment 1 is used will be described. Note that the SOI substrate used here includes the second single crystal semiconductor layer 124A in FIG. 8B on which planarization treatment is performed. As the planarization treatment, etching treatment such as dry etching treatment or wet etching treatment, polishing treatment such as CMP, or the like may be performed. Alternatively, an SOI substrate manufactured by the method described in Embodiment 2 may be employed.

Figure 13A:
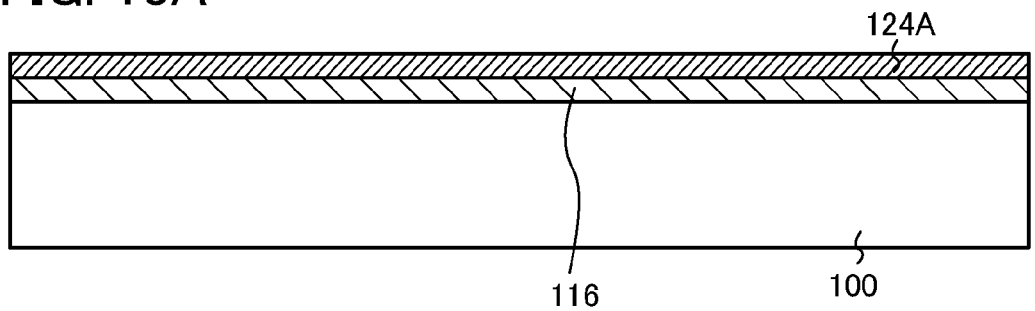
FIGS. 13A to 13D show a manufacturing process of a TFT of an embodiment.
Figure 13B:
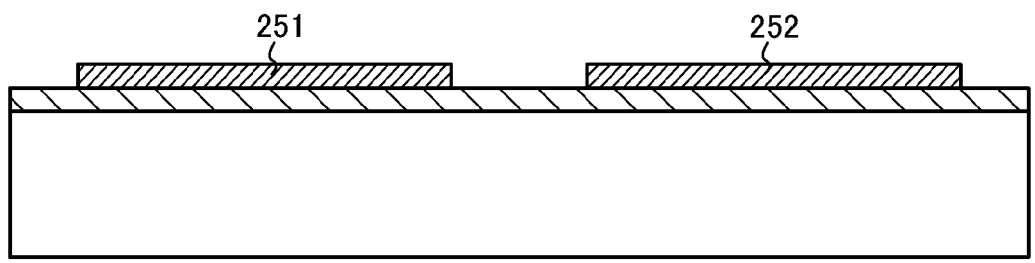

FIG. 13A is a cross-sectional view of an SOI substrate manufactured by the method described in Embodiment 1. The second single crystal semiconductor layer 124A of the SOI substrate is split into elements by etching to form semiconductor films 251 and 252 as illustrated in FIG. 13B. The semiconductor film 251 is included in an n-channel TFT, and the semiconductor film 252 is included in a p-channel TFT.

Figure 13C:
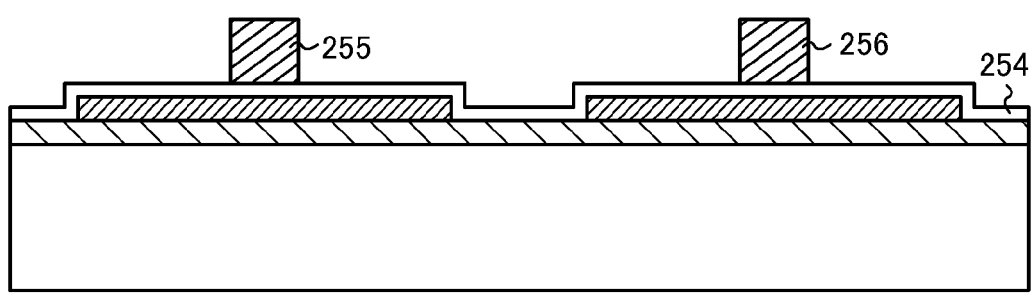

As illustrated in FIG. 13C, an insulating film 254 is formed over the semiconductor films 251 and 252. Then, a gate electrode 255 is formed over the semiconductor film 251 with the insulating film 254 therebetween, and a gate electrode 256 is formed over the semiconductor film 252 with the insulating film 254 therebetween.

Before the etching for element isolation of the second single crystal semiconductor layer 124A is performed, it is preferable to add an impurity element which serves as an acceptor, such as boron, aluminum, or gallium, or an impurity element which serves as a donor, such as phosphorus or arsenic, to the second single crystal semiconductor layer 124A in order to control the threshold voltage of the TFTs. For example, an acceptor is added to a region where the n-channel TFT is formed, and a donor is added to a region where the p-channel TFT is formed.

Figure 13D:
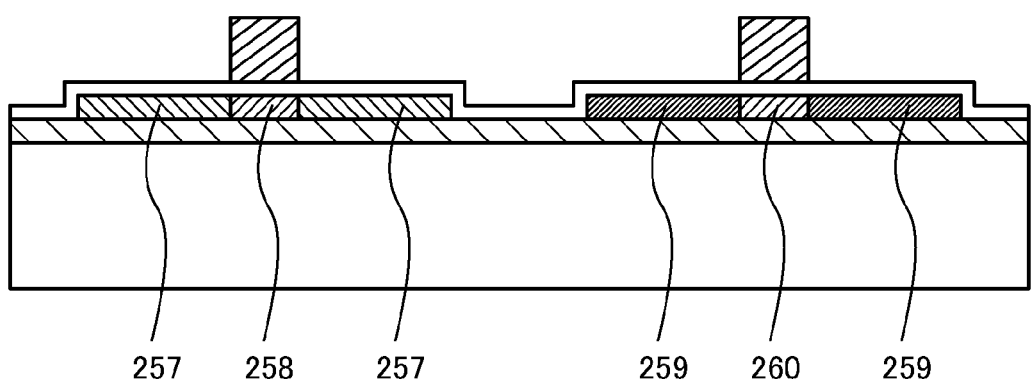

Next, as illustrated in FIG. 13D, n-type low-concentration impurity regions 257 are formed in the semiconductor film 251, and p-type high-concentration impurity regions 259 are formed in the semiconductor film 252. First, the n-type low-concentration impurity regions 257 are formed in the semiconductor film 251. In order to form the n-type low-concentration impurity regions 257, the semiconductor film 252 for the p-channel TFT is covered with a resist mask, and a donor is added to the semiconductor film 251. As the donor, phosphorus or arsenic may be added. When the donor is added by an ion doping method or an ion implantation method, the gate electrode 255 serves as a mask, and the n-type low-concentration impurity regions 257 are formed in the semiconductor film 251 in a self-aligned manner. A region of the semiconductor film 251 which overlaps with the gate electrode 255 serves as a channel formation region 258.

Next, after the mask which covers the semiconductor film 252 is removed, the semiconductor film 251 for the n-channel TFT is covered with a resist mask. Next, an acceptor is added to the semiconductor film 252 by an ion doping method or an ion implantation method. As the acceptor, boron can be added. In the step of adding the acceptor, the gate electrode 256 functions as a mask and the p-type high-concentration impurity regions 259 are formed in the semiconductor film 252 in a self-aligned manner. The high-concentration impurity regions 259 serve as a source region and a drain region. A region of the semiconductor film 252 which overlaps with the gate electrode 256 serves as a channel formation region 260. Here, the method is described in which the p-type high-concentration impurity regions 259 are formed after the n-type low-concentration impurity regions 257 are formed; however, the p-type high-concentration impurity regions 259 can be formed first.

Figure 14A:
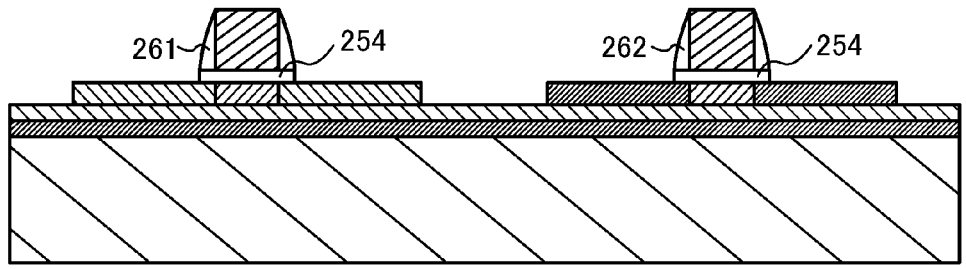
FIGS. 14A to 14C show a manufacturing process of a TFT of an embodiment.

Next, after the resist which covers the semiconductor film 251 is removed, an insulating film having a single-layer structure of a nitrogen compound such as silicon nitride or an oxide such as silicon oxide or a stacked-layer structure thereof is formed by a plasma CVD method or the like. This insulating film is anisotropically etched in a perpendicular direction to form sidewall insulating films 261 and 262 which are in contact with side surfaces of the gate electrodes 255 and 256, respectively as illustrated in FIG. 14A. By this anisotropic etching, the insulating film 254 is also etched.

Figure 14B:
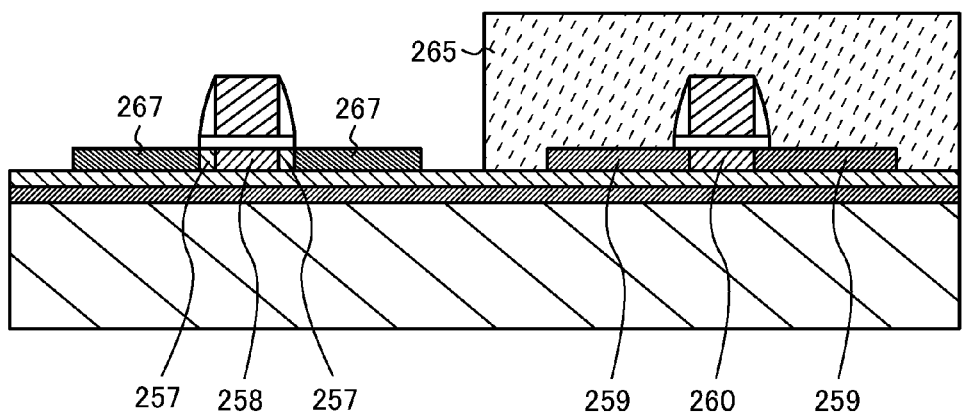

Next, as illustrated in FIG. 14B, the semiconductor film 252 is covered with a resist 265. In order to form high-concentration impurity regions serving as a source region and a drain region in the semiconductor film 251, donors are added to the semiconductor film 251 at a high dose by an ion implantation method or an ion doping method. The gate electrode 255 and the sidewall insulating film 261 serve as masks, and n-type high-concentration impurity regions 267 are formed. Then, heat treatment for activating the donors and the acceptors is performed.

Figure 14C:
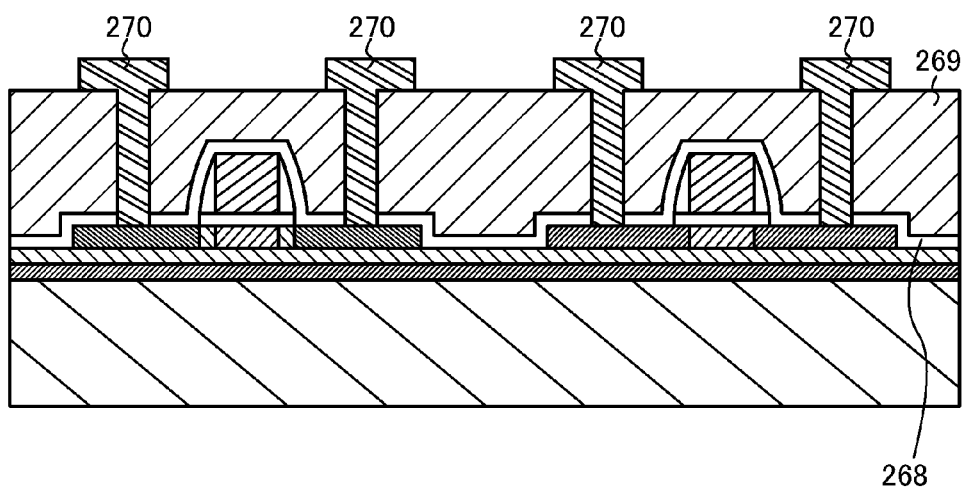

After the heat treatment for activation, the resist 265 is removed and an insulating film 268 containing hydrogen is formed as shown in FIG. 14C. After the insulating film 268 is formed, heat treatment is performed at a temperature of higher than or equal to 350° C. and lower than or equal to 450° C., whereby hydrogen contained in the insulating film 268 is diffused into the semiconductor films 251 and 252. The insulating film 268 can be formed by deposition of silicon nitride or silicon nitride oxide by plasma CVD at a process temperature of 350° C. or lower. The supply of hydrogen to the semiconductor films 251 and 252 makes it possible to efficiently compensate defects which are to be trapping centers in the semiconductor films 251 and 252 and at the interface with the insulating film 254.

After that, an interlayer insulating film 269 is formed. The interlayer insulating film 269 can have a single-layer structure or a stacked-layer structure of any of films selected from an insulating film containing an inorganic material, such as a silicon oxide film or a BPSG (boron phosphorus silicon glass) film, and an organic resin film containing polyimide, acrylic, or the like. After contact holes are formed in the interlayer insulating film 269, wirings 270 are formed as illustrated in FIG. 14C. The wirings 270 can be formed using, for example, a conductive film having a three-layer structure in which a low-resistance metal film such as an aluminum film or an aluminum alloy film is sandwiched between barrier metal films. The barrier metal films can be formed using metal films containing molybdenum, chromium, titanium, or the like.

Through the aforementioned steps, a semiconductor device having the n-channel TFT and the p-channel TFT can be manufactured. Since the concentration of the metal element contained in the semiconductor film in which the channel formation region is formed is reduced in the manufacturing process of the SDI substrate, a TFT in which off current is small and variation of the threshold voltage is suppressed can be manufactured.

Although the method for manufacturing the TFT is described with reference to FIGS. 13A to 13D and FIGS. 14A to 14C, a semiconductor device with higher added value can be manufactured by formation of various semiconductor elements such as a capacitor and a resistor together with the TFT.

This embodiment can be implemented in combination with any of the above embodiments as appropriate.

[Embodiment 4]

In this embodiment, a method for manufacturing a photoelectric conversion device using an SOI substrate manufactured by the method described in Embodiment 1 or 2 will be described with reference to FIGS. 16A to 16D, FIGS. 17A and 17B, FIGS. 18A to 18C, FIGS. 19A and 19B, and FIG. 20. Note that the same portions as those in the above-described drawings are denoted by the same reference numerals and the description thereof is omitted.

The single crystal semiconductor substrate 110 is prepared. As illustrated in FIG. 16D, the damaged region 114 is formed in a region at a predetermined depth of the single crystal semiconductor substrate 110, and a first impurity semiconductor layer 108 is formed on one surface side of the single crystal semiconductor substrate 110. Moreover, a first electrode 106 and the insulating layer 116 are stacked in this order over the one surface of the single crystal semiconductor substrate 110. Note that the first electrode 106 is formed on the side where the first impurity semiconductor layer 108 was formed or on the one surface side where the first impurity semiconductor layer 108 will be formed (see FIG. 16D).

The order of forming the damaged region 114, the first impurity semiconductor layer 108, the first electrode 106, and the insulating layer 116 is not limited; they may be formed in accordance with any of the following (1) to (4).

(1) The insulating layer 112 is formed on one surface of the single crystal semiconductor substrate 110, the first impurity semiconductor layer 108 is formed on the one surface side of the single crystal semiconductor substrate 110 by addition of an impurity element imparting one conductivity type through the surface where the insulating layer 112 is formed, and the damaged region 114 is formed in a region at a predetermined depth of the single crystal semiconductor substrate 110 by irradiation of the single crystal semiconductor substrate 110 with ions or cluster ions through the surface where the insulating layer 112 is formed. After removing the insulating layer 112, the first electrode 106 is formed over the first impurity semiconductor layer 108 on the surface side where the insulating layer 112 was formed and then the insulating layer 116 is formed over the first electrode.

(2) The insulating layer 112 is formed on one surface of the single crystal semiconductor substrate 110, the damaged region 114 is formed in a region at a predetermined depth of the single crystal semiconductor substrate 110 by irradiation of the single crystal semiconductor substrate 110 with ions or cluster ions through the surface where the insulating layer 112 is formed, and the first impurity semiconductor layer 108 is formed on the one surface side of the single crystal semiconductor substrate 110 by addition of an impurity element imparting one conductivity type through the surface where the insulating layer 112 is formed. After removing the insulating layer 112, the first electrode 106 is formed over the first impurity semiconductor layer 108 on the surface side where the insulating layer 112 was formed and then the insulating layer 116 is formed over the first electrode 106.

(3) The first electrode 106 is formed on one surface of the single crystal semiconductor substrate 110. An impurity element imparting one conductivity type is added through the surface where the first electrode 106 is formed, whereby the first impurity semiconductor layer 108 is formed on the one surface side of the single crystal semiconductor substrate 110 where the first electrode 106 is formed. Further, the damaged region 114 is formed in a region at a predetermined depth of the single crystal semiconductor substrate 110 by irradiation of the single crystal semiconductor substrate 110 with ions or cluster ions through the surface where the first electrode 106 is formed, and then the insulating layer 116 is formed over the first electrode 106.

(4) The first electrode 106 is formed on one surface of the single crystal semiconductor substrate 110. The damaged region 114 is formed in a region at a predetermined depth of the single crystal semiconductor substrate 110 by irradiation of the single crystal semiconductor substrate 110 with ions or cluster ions through the surface where the first electrode 106 is formed. An impurity element imparting one conductivity type is added through the surface where the first electrode 106 is formed, whereby the first impurity semiconductor layer 108 is formed on the one surface side of the single crystal semiconductor substrate 110 where the first electrode 106 is formed. The insulating layer 116 is formed over the first electrode 106.

In this embodiment, the example in which formation order follows (1) is described with reference to FIGS. 16A to 16D. As for portions denoted by the same reference numerals as those in the aforementioned drawings, the above-described description can be referred to; therefore, detailed description thereof is omitted here.

The insulating layer 112 is formed on one surface of the single crystal semiconductor substrate 110. Then, the first impurity semiconductor layer 108 is formed by addition of an impurity element imparting one conductivity type through the surface where the insulating layer 112 is formed (see FIG. 16A). Although it is possible to employ a structure where the insulating layer 112 is not provided, it is preferable to provide the insulating layer 112 so that the single crystal semiconductor substrate 110 is prevented from being contaminated and the surface of the single crystal semiconductor substrate 110 is prevented from being damaged in later ion introduction.

An impurity element imparting one conductivity type is added to the single crystal semiconductor substrate 110, whereby the first impurity semiconductor layer 108 is formed on the one surface side of the single crystal semiconductor substrate 110. The first impurity semiconductor layer 108 is formed to a thickness of 30 nm to 150 nm, preferably 50 nm to 100 nm. The impurity element imparting one conductivity type is added through the insulating layer 112 formed over the single crystal semiconductor substrate 110. For example, boron is added as the impurity element imparting one conductivity type, whereby the p-type first impurity semiconductor layer 108 is formed. Boron is preferably added with an ion doping apparatus in which ions generated from a source gas which is $B_2H_6$ or $BF_3$ are accelerated by voltage without mass separation and thus generated ion flow is delivered to the substrate. This is because the area to be irradiated with the ion beam can be enlarged even when the area of the single crystal semiconductor substrate 110 exceeds 300 mm diagonally, and the process can be efficient. For example, a linear ion beam whose long side has a length of more than 300 mm is formed and delivered from one end to the other end of the single crystal semiconductor substrate 110; thus, the first impurity semiconductor layer 108 can be formed uniformly over the entire surface of the single crystal semiconductor substrate 110.

The first impurity semiconductor layer 108 can be formed by a thermal diffusion method. However, a thermal diffusion method is carried out before the formation of the damaged region because a high temperature of about 900° C. or more is applied.

In the photoelectric conversion device of this embodiment, the first impurity semiconductor layer 108 is disposed on the side opposite to the light incidence side, so that a back surface field (BSF) is formed. If the single crystal semiconductor substrate 110 is a p-type substrate, the impurity semiconductor layer containing a p-type impurity element (the first impurity semiconductor layer 108 in this embodiment) is not necessary. However, by arrangement of a high-concentration p-type region (the first impurity semiconductor layer 108) and a low-concentration p-type region (the first single crystal semiconductor layer sliced from the single crystal semiconductor substrate) in this manner, light confinement effect can prevent recombination of carriers (electrons and holes) generated by light excitation and increase carrier collecting efficiency. Accordingly, the photoelectric conversion efficiency of the photoelectric conversion device can be improved.

Figure 16A:
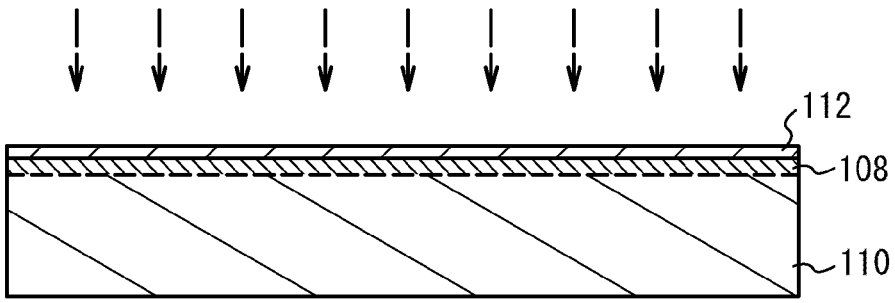
FIGS. 16A to 16D show a manufacturing process of a photoelectric conversion device according to an embodiment.
Figure 16B:
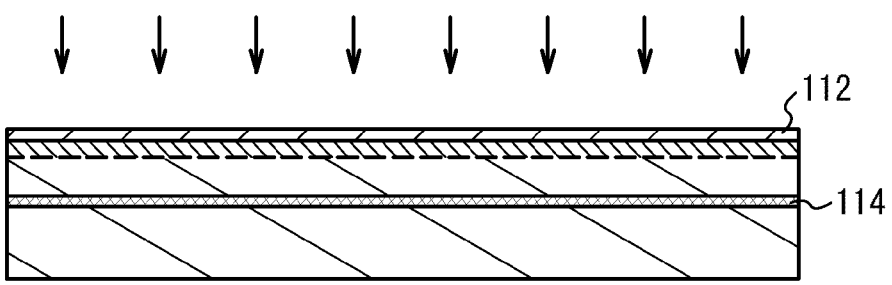

The single crystal semiconductor substrate 110 is irradiated with an ion beam including ions accelerated by an electric field, so that the damaged region 114 is formed in a region at a predetermined depth from the surface of the single crystal semiconductor substrate 110 (see FIG. 16B).

Moreover, when the damaged region 114 is formed in such a manner that the substrate is irradiated through the first impurity semiconductor layer 108 with the ions or cluster ions generated from a source gas containing hydrogen, hydrogenation of the first impurity semiconductor layer 108 can also be performed at the same time.

Figure 16C:
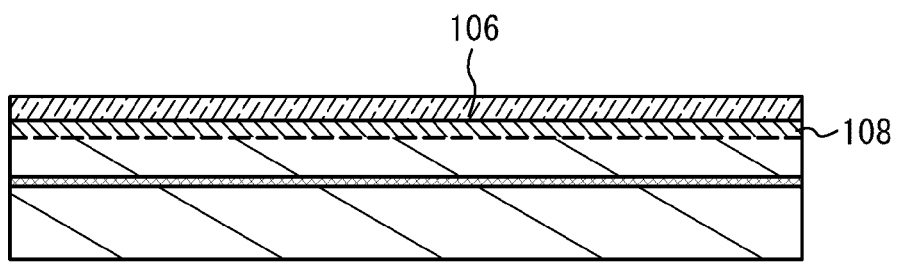
Figure 16D:
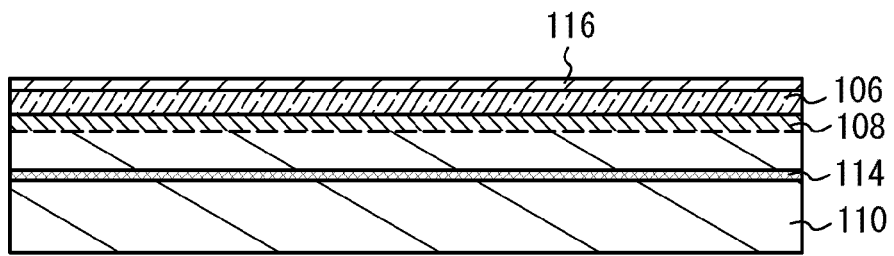

After the insulating layer 112 formed over the single crystal semiconductor substrate 110 is removed, the first electrode 106 is formed over the first impurity semiconductor layer 108 (see FIG. 16C).

The first electrode 106 needs to be formed using a material which resists the temperature of heat treatment later performed for splitting the single crystal semiconductor substrate 110; therefore, a metal with a high melting point is preferred. Specifically, the first electrode 106 needs to have heat resistance to a temperature about the strain point of the supporting substrate 100. For example, a metal material such as titanium, molybdenum, tungsten, tantalum, chromium, or nickel is applied. Further, a stacked structure of any of the above metal materials and a nitride thereof can be employed. For example, a stacked structure of a titanium nitride layer and a titanium layer, a stacked structure of a tantalum nitride layer and a tantalum layer, a stacked structure of a tungsten nitride layer and a tungsten layer, or the like is given. In the case of the stacked structure including a nitride, the nitride is formed in contact with the first impurity semiconductor layer 108. By the formation of the nitride, the first electrode 106 and the first impurity semiconductor layer 108 can have closer contact to each other. The first electrode 106 is formed by an evaporation method or a sputtering method.

The insulating layer 116 is formed over the first electrode 106 (see FIG. 16D). For example, the insulating layer 116 is formed using a stack of a 50-nm-thick silicon oxynitride layer, a 50-nm-thick silicon nitride oxide layer, and a 50-nm-thick silicon oxide layer. These insulating layers can be formed by a plasma CVD method. The silicon oxide layer, which is the uppermost layer and serves as the bonding plane, has an Ra of 0.5 nm or less, preferably 0.3 nm or less after the formation, and the silicon oxide layer is formed by, for example, a plasma CVD method using TEOS (tetraethyl-ortho silicate) for a source gas. When the insulating layer 116 includes a silicon insulating layer containing nitrogen, specifically a silicon nitride oxide layer, diffusion of impurities from the supporting substrate 100 which is later bonded can be prevented.

Figure 17A:
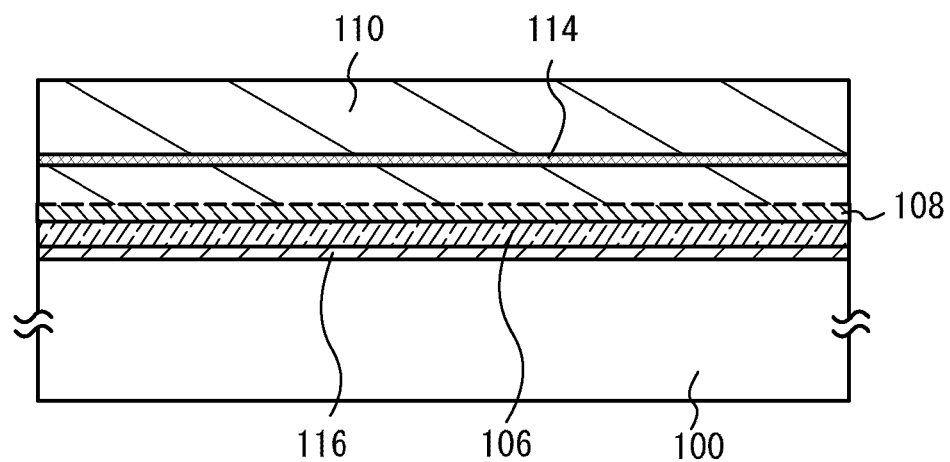
FIGS. 17A and 17B show a manufacturing process of a photoelectric conversion device according to an embodiment.
Figure 17B:
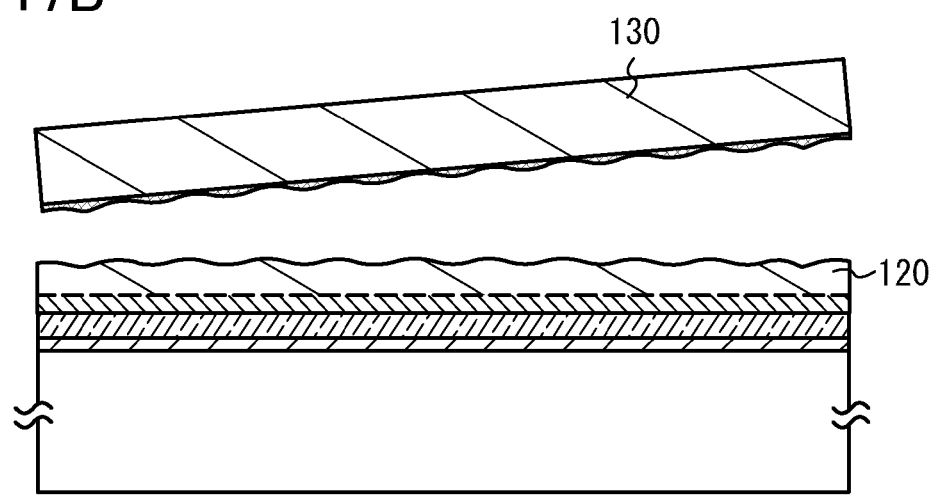

The surface of the single crystal semiconductor substrate 110 that is provided with the first electrode 106 is bonded to one surface of the supporting substrate 100 (see FIG. 17A). In this embodiment, the insulating layer 116 is interposed between the first electrode 106 and the supporting substrate 100. The bonding plane corresponds to one surface of the insulating layer 116 (the surface not in contact with the first electrode 106) and the one surface of the supporting substrate 100.

After the single crystal semiconductor substrate 110 and the supporting substrate 100 are bonded to each other, heat treatment is performed so that bonding force is increased.

If the surface of the first electrode 106 (the surface opposite to the surface on the first impurity semiconductor layer 108 side) is smooth, specifically the average surface roughness Ra thereof is 0.5 nm or less, preferably 0.3 nm or less, bonding with the supporting substrate might be possible even without the insulating layer 116. In that case, the first electrode 106 and the supporting substrate may be directly bonded to each other without the insulating layer 116.

Then, heat treatment is performed to separate the first single crystal semiconductor layer 120 from the single crystal semiconductor substrate 110 along the damaged region 114. The first single crystal semiconductor layer 120 separated from the single crystal semiconductor substrate 110 remains over the supporting substrate 100, and thus a so-called SOI structure is obtained. The first single crystal semiconductor layer 120 has the same or substantially the same crystallinity as the single crystal semiconductor substrate 110. Moreover, the single crystal semiconductor substrate 130 from which the first single crystal semiconductor layer 120 has been separated is obtained (see FIG. 17B).

Through the foregoing steps, the first single crystal semiconductor layer 120 fixed to the supporting substrate 100 can be obtained. Note that the insulating layer 116, the first electrode 106, and the first impurity semiconductor layer 108 are provided between the supporting substrate 100 and the first single crystal semiconductor layer 120.

Figure 18A:
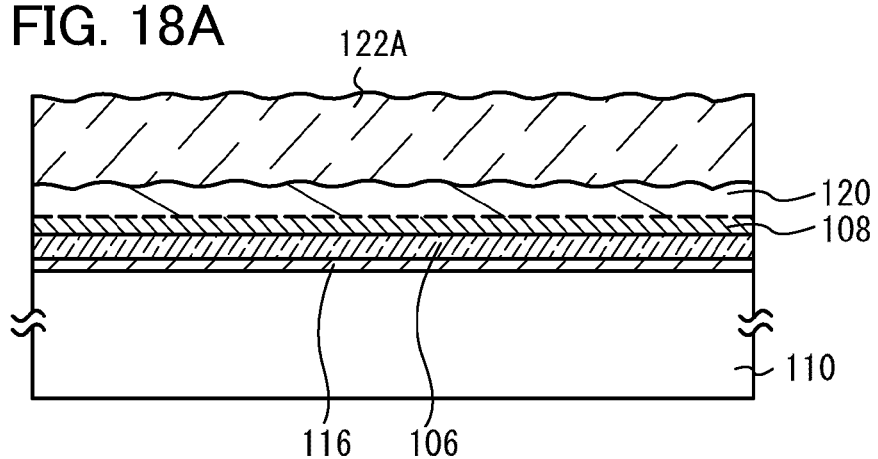
FIGS. 18A to 18C show a manufacturing process of a photoelectric conversion device according to an embodiment.
Figure 18B:
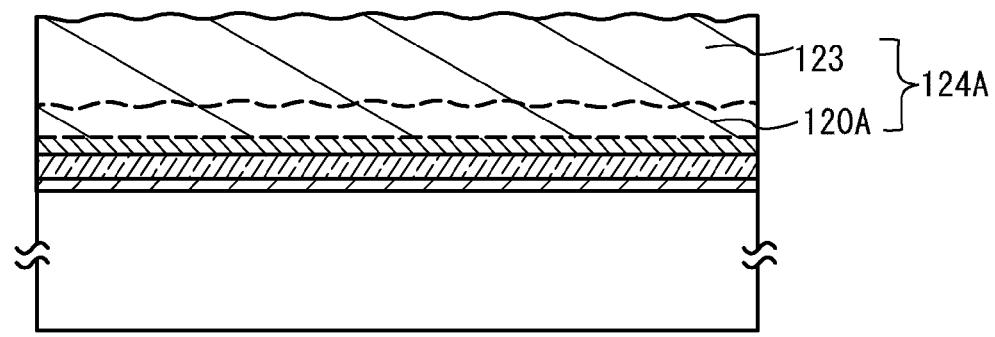

Over the first single crystal semiconductor layer 120, the first amorphous semiconductor layer 122A is formed by the method described in Embodiment 1 (see FIG. 18A).

When the total thickness of the first single crystal semiconductor layer 120 and the first amorphous semiconductor layer 122A is 800 nm or more, preferably, 1000 nm or more and cycle time or productivity such as film formation time or a film formation cost are considered, it is preferable that the first amorphous semiconductor layer 122A have a thickness of greater than or equal to 100 nm and less than or equal to 2000 nm.

As the first amorphous semiconductor layer 122A, an intrinsic semiconductor is formed. Alternatively, a p-type amorphous semiconductor layer or an n-type amorphous semiconductor layer may be formed.

Heat treatment is performed, so that the first amorphous semiconductor layer 122A is made to solid-phase epitaxially grow. Through this heat treatment, the second single crystal semiconductor layer 124A is formed of the third single crystal semiconductor layer 123 and the fourth single crystal semiconductor layer 120A (see FIG. 18B). When the second single crystal semiconductor layer 124A is used for a photoelectric conversion layer, the photoelectric conversion efficiency can be improved because the second single crystal semiconductor layer 124A has a large thickness.

Note that as described in Embodiment 2, a structure may be employed in which the third single crystal semiconductor layer 123 is removed by etching and the fourth single crystal semiconductor layer 120A is used for a photoelectric conversion layer as long as the fourth single crystal semiconductor layer 120A has a sufficient thickness.

Figure 18C:
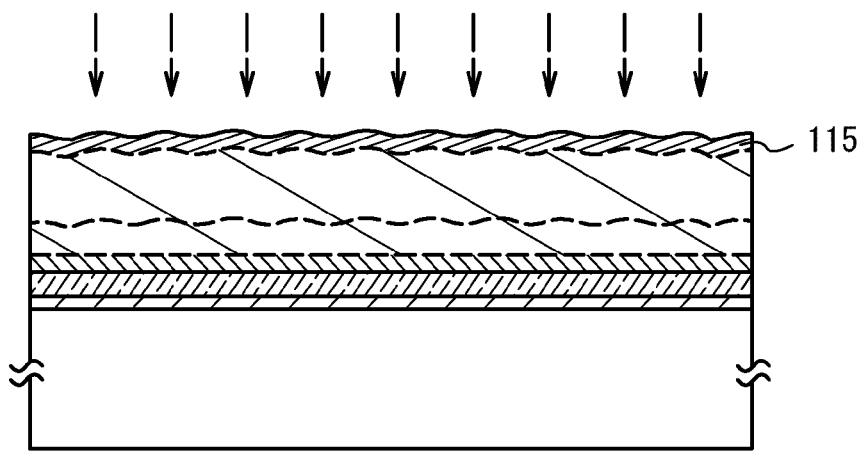

An impurity element imparting a conductivity type opposite to that of the first impurity semiconductor layer 108 is added through the one surface of the third single crystal semiconductor layer 123 (the surface which is not in contact with the fourth single crystal semiconductor layer 120A), whereby the second impurity semiconductor layer 115 is formed (see FIG. 18C). The second impurity semiconductor layer 115 is formed to a thickness of 30 nm to 150 nm, preferably, 50 nm to 100 nm. For example, phosphorus or arsenic is added as the impurity element imparting a conductivity type opposite to that of the first impurity semiconductor layer 108, whereby the n-type second impurity semiconductor layer 115 is formed. If the supporting substrate 100 is a glass substrate, the substrate cannot resist process temperature in a thermal diffusion method; therefore, the impurity element is added by ion implantation or ion doping.

An amorphous semiconductor layer having a conductivity type (e.g., n-type) opposite to that of the first impurity semiconductor layer 108 is formed on the first amorphous semiconductor layer 122A although it is not illustrated. Then, heat treatment is performed to promote solid-phase growth, whereby the second single crystal semiconductor layer 124A and the second impurity semiconductor layer 115 can be formed. An n-type amorphous semiconductor layer can be formed in such a manner that silicon hydride such as monosilane or disilane is used as a source gas and phosphine ($PH_3$)

which is an n-type impurity is added to the source gas. When a p-type amorphous semiconductor layer is formed, diborane ($B_2H_6$) may be added.

The second impurity semiconductor layer 115 can be formed of an amorphous semiconductor or a microcrystalline semiconductor. The use of an amorphous semiconductor or a microcrystalline semiconductor for the second impurity semiconductor layer 115 does not lead to problems because a region mainly functioning as a photoelectric conversion layer is formed using the single crystal semiconductor layer. In the case of using an amorphous semiconductor or a microcrystalline semiconductor for the second impurity semiconductor layer 115, the thickness is preferably small, for example 50 nm to 100 nm. This is for the purpose of preventing recombination of carriers in the second impurity semiconductor layer 115.

Figure 19A:
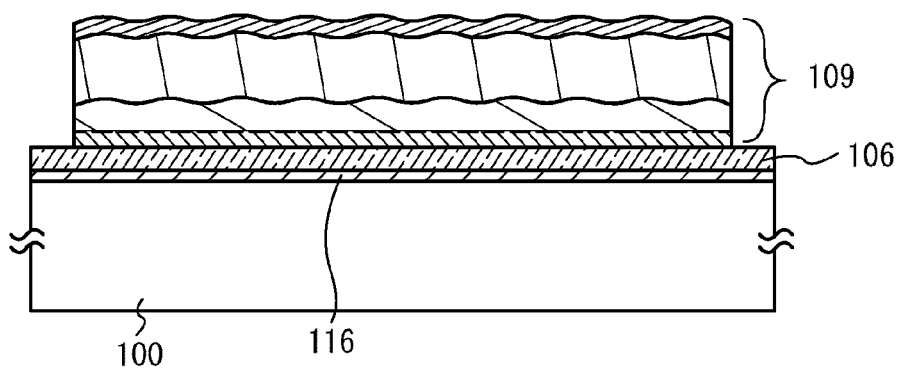
FIGS. 19A and 19B show a manufacturing process of a photoelectric conversion device according to an embodiment.

In this manner, a unit cell 109 can be obtained in which the first impurity semiconductor layer 108 having one conductivity type, the second single crystal semiconductor layer 124A, and the second impurity semiconductor layer 115 having a conductivity type opposite to the one conductivity type are stacked in this order (see FIG. 19A).

The first impurity semiconductor layer 108, the second single crystal semiconductor layer 124A, and the second impurity semiconductor layer 115 which are provided over the first electrode 106 are selectively etched to expose part of the first electrode 106 (preferably an end portion of the first electrode 106) (see FIG. 19A).

In order that the photoelectric conversion device functions, it is necessary to extract electric energy, which has been converted from light, from electrodes corresponding to a positive electrode and a negative electrode. The first electrode 106 serves as one of electrodes corresponding to a positive electrode and a negative electrode; however, the upper surface of the first electrode 106 is covered with the single crystal semiconductor layers and the lower surface thereof is provided with the supporting substrate 100. Therefore, in this state, electricity is difficult to extract to the outside. Consequently, it is preferable to etch the layers over the first electrode 106 to expose part of the first electrode 106 and to form a leading electrode.

Specifically, a mask is formed using a resist or an insulating layer such as a silicon nitride layer over the second impurity semiconductor layer 115, and etching may be performed using the mask. The etching may be dry etching with use of a fluorine-based gas such as $NF_3$ or $SF_6$ under the condition where at least the etching selectivity between the first electrode 106 and the layers (the first impurity semiconductor layer 108 to the second impurity semiconductor layer 115) formed over the first electrode 106 is sufficiently high. Note that after the etching, the mask is removed because it is no longer necessary.

Although this embodiment describes the example in which the first electrode 106 is exposed after the formation of the second impurity semiconductor layer 115, the second impurity semiconductor layer 115 can alternatively be formed after the exposure of the first electrode 106. Specifically, the third single crystal semiconductor layer 123 is formed by heat treatment, a mask is formed over the third single crystal semiconductor layer 123, and then etching is performed using the mask to expose part of the first electrode 106. After removing the mask which is no longer necessary, an impurity element imparting a conductivity type opposite to that of the first impurity semiconductor layer 108 is added to the third single crystal semiconductor layer 123, whereby the second impurity semiconductor layer 115 is formed.

The second electrode 118 is formed over the second impurity semiconductor layer 115. An auxiliary electrode 160 is formed in contact with the exposed part of the first electrode 106 (see FIG. 19B).

Figure 19B:
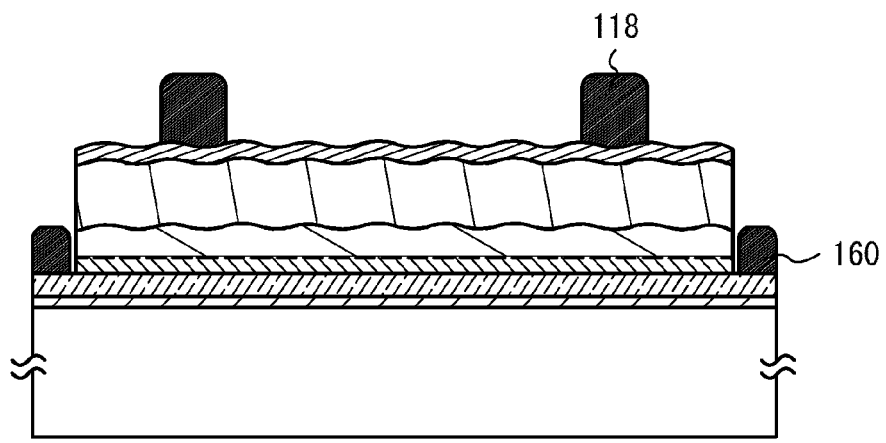
Figure 20:
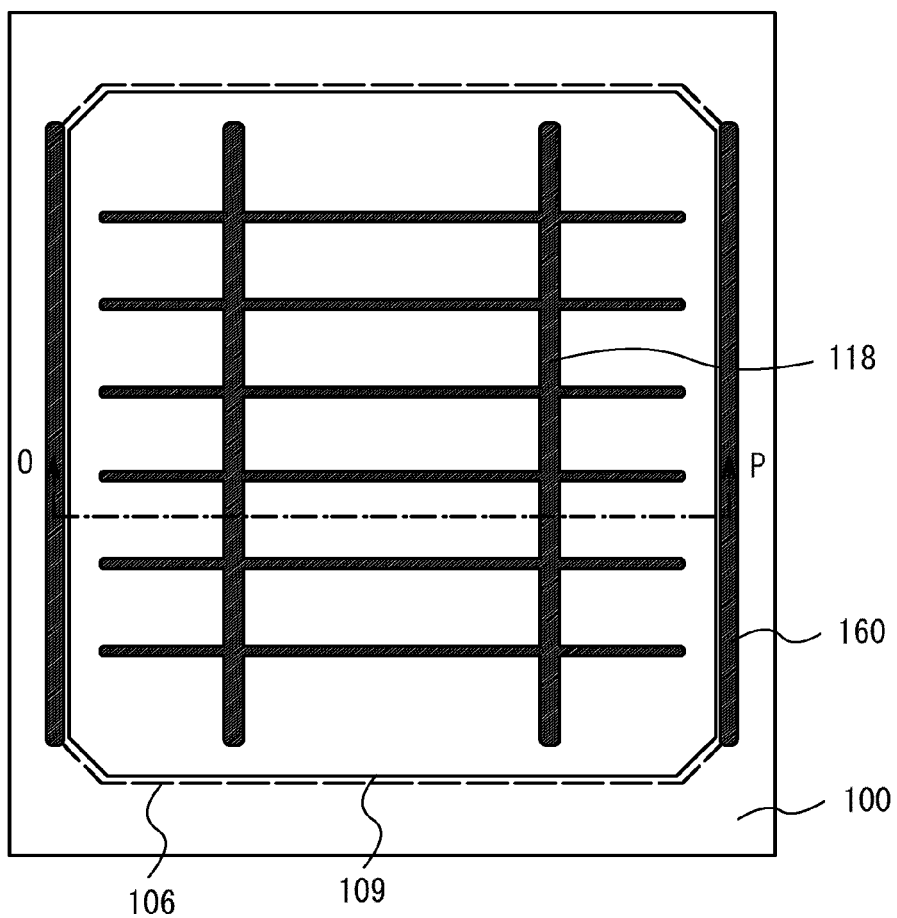
FIG. 20 is a top view of a photoelectric conversion device according to an embodiment.

The second electrode 118 is formed to have a grid shape (or a comb-like shape or a pectinate shape) when seen from above, as illustrated in FIG. 20. Thus, the unit cell 109 can be irradiated with light and can efficiently absorb light. There is no particular limitation on the shape of the second electrode 118; however, it is needless to say that the effective area where light enters increases when the area covering the unit cell 109 (the second impurity semiconductor layer 115) is made as small as possible. Note that FIG. 19B corresponds to a cross section taken along line O-P of FIG. 20.

The auxiliary electrode 160 can be formed through the same steps as the second electrode 118. In the photoelectric conversion device of this embodiment, the first electrode 106 functions as one of electrodes corresponding to a positive electrode and a negative electrode. However, the first electrode 106 is formed all over the surface between the supporting substrate 100 and the unit cell 109 and thus wirings cannot be arranged freely. That is why the auxiliary electrode 160 is formed to make it easy to extract the electric energy which has been converted from light. The auxiliary electrode 160 serves as an extraction electrode.

The second electrode 118 and the auxiliary electrode 160 are formed by a printing method or the like using aluminum, silver, lead-tin (solder), or the like. For example, the second electrode 118 and the auxiliary electrode 160 can be formed using a silver paste by a screen printing method. Note that in the case of forming the electrodes by a screen printing method using a paste or the like, the thickness of each electrode can be about several micrometers to several hundreds of micrometers. Note that these electrodes are illustrated in schematic diagrams which do not necessarily illustrate the actual dimension.

Through the above steps, a photoelectric conversion device can be manufactured. In the case where a tandem photoelectric conversion device is manufactured, the unit cell 109 is formed as illustrated in FIG. 19A, and then, unit cells 109 may be stacked thereover. After that, the second electrode 118 and the auxiliary electrode 160 are formed as illustrated in FIG. 19B.

Note that a passivation layer which also functions as an antireflection layer is preferably formed over the unit cell 109.

It is said that a semiconductor surface generally has a reflectance of 30% to 50%, though depending on wavelength. The reflection at the light incidence plane leads to loss of incident light, which is a factor of decrease in photoelectric conversion efficiency. Therefore, the passivation layer whose refractive index is between the refractive indices of air and semiconductor, which is a material of the light incidence surface of the unit cell 109, and whose transmittance does not interrupt light incidence is formed over the light incidence surface of the unit cell 109 (over the second impurity semiconductor layer 115 in this embodiment). Thus, the reflection at the incidence surface of the unit cell 109 can be prevented. As the passivation layer, a silicon nitride layer, a silicon nitride oxide layer, a magnesium fluoride layer, or the like can be used.

The passivation layer is provided between the unit cell 109 and the second electrode 118 and between the unit cell 109 and the auxiliary electrode 160. In this case, after the passivation layer is formed over the unit cell 109, the passivation layer is etched to form openings so that part of the second impurity semiconductor layer 115 and part of the first electrode 106 are exposed. Alternatively, the passivation layer provided with openings can be formed by a lift-off method or the like. Then, the second electrode 118 is formed by a printing method in contact with the second impurity semiconductor layer 115 through the openings provided in the passivation layer. By the same step, the auxiliary electrode 160 is formed in contact with the first electrode 106 through the openings provided in the passivation layer.

In the manufacturing process according to this embodiment, a single crystal semiconductor layer having a thickness of 1000 nm or more that functions as a photoelectric conversion layer can be obtained by employing a crystal solid-phase epitaxial growth technique. By the solid-phase epitaxial growth, the amount of a single crystal semiconductor used as a material can be sufficient as long as the single crystal semiconductor can function as a seed crystal and the consumption of the single crystal semiconductor can be therefore suppressed. In the case of an amorphous semiconductor or a microcrystalline semiconductor, grain boundaries trap carriers to decrease the photoelectric conversion efficiency; in contrast, a single crystal semiconductor having no grain boundaries achieves excellent photoelectric conversion efficiency and a highly-efficient photoelectric conversion device can therefore be provided. Further, the structure body portion that supports the photoelectric conversion device has been conventionally formed using a single crystal semiconductor. However, with the structure in which a single crystal semiconductor layer sliced from a single crystal semiconductor substrate is fixed to a supporting substrate by a technique of bonding different kinds of materials, the consumption of a single crystal semiconductor can be suppressed. Further, the single crystal semiconductor substrate from which the single crystal semiconductor layer has been separated can be reused repeatedly. Therefore, the resources can be effectively used.

This embodiment can be implemented in combination with any of the above embodiments as appropriate.

[Embodiment 5]

In this embodiment, a semiconductor device provided with a photoelectric conversion element which includes an SOI substrate manufactured by the method described in Embodiment 1 or 2, and a manufacturing method thereof will be described. Note that the same portions as those in the above-described drawings are denoted by the same reference numerals and the description thereof is omitted.

Figure 21A:
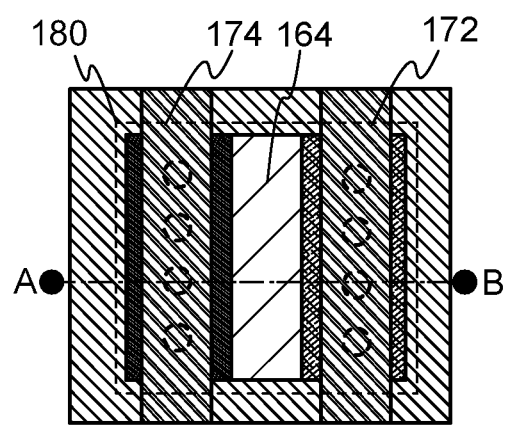
FIGS. 21A and 21B are respectively a top view and a cross-sectional view of a photoelectric conversion element according to an embodiment.
Figure 21B:
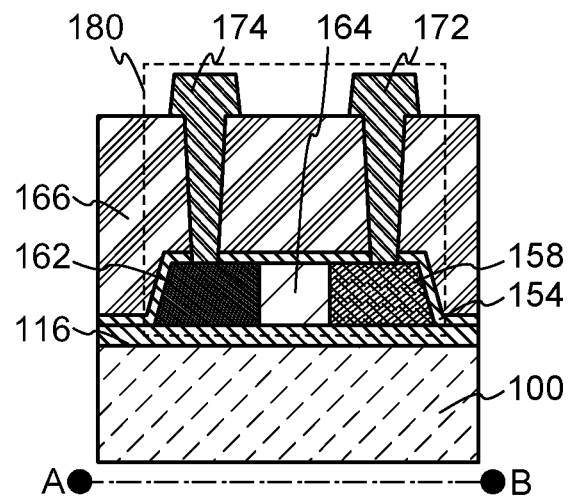

A photoelectric conversion element 180 relating to one embodiment of the disclosed invention is provided over the light-transmitting supporting substrate 100 (see FIGS. 21A and 21B). Here, FIG. 21B corresponds to a cross section taken along line A-B of FIG. 21A.

The photoelectric conversion element 180 includes an island-shaped single crystal semiconductor layer including a semiconductor region 164 having an effect of photoelectric conversion, a semiconductor region 158 having a first conductivity type (p-type conductivity, here), and a semiconductor region 162 having a second conductivity type (n-type conductivity, here); an insulating layer 154 and an insulating layer 166 which are formed so as to cover the island-shaped single crystal semiconductor layer; a first electrode 172 electrically connected to the semiconductor region 158 having the first conductivity type; and a second electrode 174 electrically connected to the semiconductor region 162 having the second conductivity type. Here, the semiconductor region 158 having the first conductivity type and the semiconductor region 162 having the second conductivity type are adjacent to the semiconductor region 164 having an effect of photoelectric conversion and separated by the semiconductor region 164 having an effect of photoelectric conversion. Note that the first conductivity type and the second conductivity type can be interchanged with each other.

In addition, the insulating layer 116 is provided between the supporting substrate 100 and the photoelectric conversion element 180. The insulating layer 116 has a function of fixing the photoelectric conversion element 180 to the supporting substrate 100.

The operation of the photoelectric conversion element 180 is as follows. In the photoelectric conversion element 180, when light enters the semiconductor region 164 having an effect of photoelectric conversion, electrons and holes are generated in the semiconductor region 164. In the case where voltage is not applied from the outside to a region between the semiconductor region 158 having the first conductivity type and the semiconductor region 162 having the second conductivity type (in the case of non-bias), the electrons generated flow in a direction toward an n-type semiconductor region because of the influence of a self-aligned electric field. In a similar manner, the holes generated flow in a direction toward a p-type semiconductor region. In the case where voltage is applied from the outside (for example, in the case where reverse bias is applied), electrons and holes flow because of the influence of a self-aligned electric field and the voltage from the outside.

An optical sensor can be formed by utilizing the dependence of the resulting current upon the intensity of light. In addition, an electric generating system can be obtained by extracting electromotive force due to light to the outside of the photoelectric conversion element.

Here, the crystallinity of the island-shaped semiconductor layer (the semiconductor regions 162, 164, and 158) included in the photoelectric conversion elements in this embodiment is a single crystal. In particular, the crystallinity of the semiconductor region 164 having an effect of photoelectric conversion is a single crystal. With the use of a single crystal semiconductor for a photoelectric conversion element, the amount of dark current (current which flows when light irradiation is not performed) can be reduced as compared to the case of using an amorphous semiconductor or a polycrystalline semiconductor. Further, with the use of a single crystal semiconductor for a photoelectric conversion element, the amount of current which flows when light irradiation is performed can be increased as compared to the case of using a polycrystalline semiconductor. Accordingly, sensitivity as an optical sensor is improved. In addition, with the use of a single crystal semiconductor for a photoelectric conversion element, photoelectric conversion efficiency is improved. These effects can be obtained since a trap of photogenerated carriers due to defects and the like can be sufficiently suppressed.

In addition, as described here, because of a light-transmitting property of the supporting substrate, a structure in which light from an object (reflection light from the object) enters from the supporting substrate side (a structure in which light is detected from the supporting substrate side) can be employed. In this case, the degree of freedom of element layout is improved as compared to the case where light of the object enters from an electrode (or a wiring) side. In this manner, when the supporting substrate has a light-transmitting property, there is an advantage that integration can be performed easily as compared to the case of a supporting substrate which does not have a light-transmitting property.

Next, a manufacturing process of the photoelectric conversion element is described with reference to FIGS. 22A to 22H. Manufacturing steps of an SOI substrate used for manufacturing the photoelectric conversion element are similar to those in Embodiment 1 or 2; therefore, the detailed description is omitted here. In this embodiment, an SOI substrate manufactured by the method described in Embodiment 1 is used as an example.

First, in the SOI substrate manufactured by the method described in Embodiment 1, the surface of the second single crystal semiconductor layer 124A is irradiated with laser light to planarize the surface, so that planarity of the surface is improved. Note that a planarization step is not necessarily performed as long as planarity is sufficient. In the case where an SOI substrate manufactured by the method described in Embodiment 2 is used, the fourth single crystal semiconductor layer 120A is used instead of the second single crystal semiconductor layer 124A.

Note that it is preferable that the second single crystal semiconductor layer 124A be partially melted by the laser light irradiation. This is because, if the second single crystal semiconductor layer 124A is completely melted, it is microcrystallized due to disordered nucleation after being in a liquid phase, so that the crystallinity thereof decreases. On the other hand, by partial melting, crystal growth can proceed based on a non-melted solid-phase portion. Therefore, crystal quality can be improved as compared to the case where the second single crystal semiconductor layer 124A is completely melted. In addition, by partial melting, incorporation of oxygen, nitrogen, or the like from the insulating layer 116 can be suppressed. Note that the term "partial melting" in the above description means melting of the second single crystal semiconductor layer 124A with laser light irradiation to a depth smaller than that of an interface on the insulating layer 116 side (i.e., smaller than the thickness of the second single crystal semiconductor layer 124A). In other words, it refers to a state in which the upper portion of the second single crystal semiconductor layer 124A is melted into a liquid phase whereas the lower portion is not melted and remains in a solid phase. Note that the term "complete melting" means that the second single crystal semiconductor layer 124A is melted to the interface with the insulating layer 116 and becomes a liquid state.

A pulsed laser is preferably used for the laser light irradiation. This is because high energy can be obtained and thus a partial melting state can easily be produced. The repetition rate is preferably, but not limited to, approximately greater than or equal to 1 Hz and less than or equal to 10 MHz. Examples of the pulsed laser include an Ar laser, a Kr, laser, an excimer (ArF, KrF, XeCl) laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti:sapphire laser, a copper vapor laser, a gold vapor laser, and the like. A continuous-wave laser may alternatively be used as long as it enables partial melting. Note that, as examples of continuous-wave lasers, an Ar laser, a Kr laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti:sapphire laser, a helium-cadmium laser, and the like can be given.

It is necessary that the wavelength of the laser light be set to such a wavelength as is absorbed by the second single crystal semiconductor layer 124A. The wavelength may be determined in consideration of the skin depth of the laser light and the like. For example, the wavelength of the laser light can be in the range of greater than or equal to 250 nm and less than or equal to 700 nm. Further, the energy density of the laser light can be determined in consideration of the wavelength of the laser light, the skin depth of the laser light, the thickness of the second single crystal semiconductor layer 124A, or the like. For example, the energy density of the laser light may be set in the range of greater than or equal to 300 $mJ/cm^2$ and less than or equal to 800 $mJ/cm^2$. Note that the above range of the energy density is an example in the case where a XeCl excimer laser (wavelength: 308 nm) is used as the pulsed laser.

The irradiation with the laser light can be performed in an atmosphere containing oxygen such as an air atmosphere or in an inert atmosphere such as a nitrogen atmosphere or an argon atmosphere. In order to perform irradiation with the laser light in an inert atmosphere, the irradiation with the laser light may be performed in an airtight chamber while the atmosphere in the chamber may be controlled. In the case where the chamber is not used, an inert atmosphere can be formed by blowing an inert gas such as a nitrogen gas to the surface which is irradiated with the laser light.

Note that the irradiation in an inert atmosphere such as a nitrogen atmosphere is more effective in improving flatness of the second single crystal semiconductor layer 124A than the irradiation in an air atmosphere. In addition, the inert atmosphere has higher effect of suppressing generation of cracks and ridges than the air atmosphere, and the energy density range applicable for the laser light is widened. Note that irradiation with the laser light may be performed in a reduced-pressure atmosphere. When irradiation with the laser light is performed in a reduced-pressure atmosphere, the same effects as those obtained by the irradiation in an inert atmosphere can be obtained.

In addition, it is preferable that the surface of the second single crystal semiconductor layer 124A be cleaned before the irradiation treatment with the laser light.

Through the above steps, an SOI substrate having the second single crystal semiconductor layer 124A with reduced surface roughness can be obtained.

Next, manufacturing steps of the photoelectric conversion element 180 with the use of the SOI substrate will be described. First, the SOI substrate having the structure in which the insulating layer 116 and the second single crystal semiconductor layer 124A are provided over the supporting substrate 100 is prepared according to the above steps (see FIG. 22A).

A small quantity of a p-type impurity element such as boron, aluminum, or gallium, or a small quantity of an n-type impurity element such as phosphorus or arsenic may be added to the second single crystal semiconductor layer 124A. A region to which the impurity element is added and the kind of impurity element to be added can be changed as appropriate.

Then, a mask 150 is formed over the second single crystal semiconductor layer 124A. The second single crystal semiconductor layer 124A is patterned using the mask 150, so that an island-shaped semiconductor layer 152 used for the photoelectric conversion element is formed (see FIG. 22B). The mask 150 can be formed by photolithography or the like using a resist material. Further, as etching treatment in the patterning, either wet etching or dry etching can be employed. After formation of the island-shaped semiconductor layer 152, the mask 150 is removed.

Figure 22A:
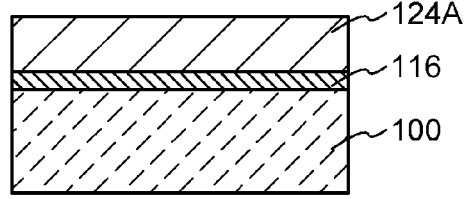
FIGS. 22A to 22H show a manufacturing process of a photoelectric conversion element according to an embodiment.
Figure 22B:
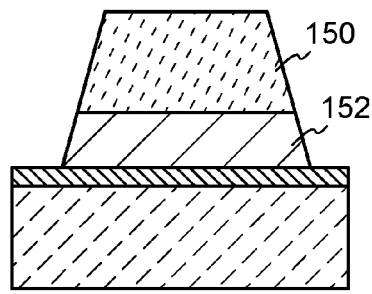
Figure 22C:
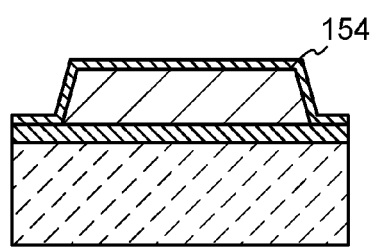
Figure 22D:
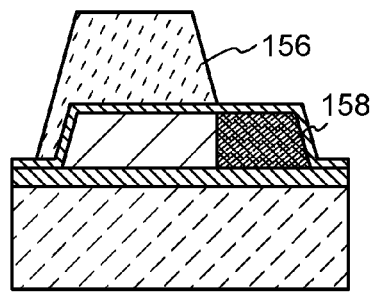
Figure 22E:
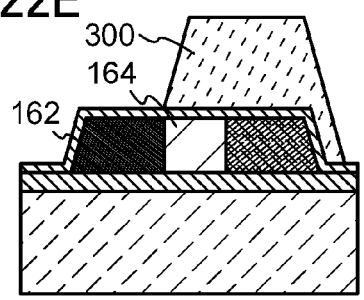

Next, the insulating layer 154 is formed so as to cover the semiconductor layer 152 (see FIG. 22C). The insulating layer 154 is not necessarily formed; however, in the case where the insulating layer 154 is provided, it can suppress damage to the semiconductor layer 152 at the time of addition of an impurity element performed later. Note that as the insulating layer 154, a single layer of a silicon oxide film is formed by a plasma CVD method in this embodiment. Alternatively, as the insulating layer 154, a film containing silicon oxynitride, silicon nitride oxide, silicon nitride, hafnium oxide, aluminum oxide, tantalum oxide, or the like may be formed with a single-layer structure or a stacked-layer structure.

As a formation method other than a plasma CVD method, a sputtering method or a method using oxidation or nitridation by high-density plasma treatment can be given. High-density plasma treatment is performed using, for example, a mixed gas of a rare gas such as helium, argon, krypton, or xenon and a gas such as oxygen, nitrogen oxide, ammonia, nitrogen, or hydrogen. In this case, by exciting plasma by introduction of microwaves, plasma with a low electron temperature and high density can be generated. When a surface of the semiconductor layer 152 is oxidized or nitrided by oxygen radicals (OH radicals may be included) or nitrogen radicals (NH radicals may be included) which are produced by such high-density plasma, the insulating layer 154 with a thickness of greater than or equal to 1 nm and less than or equal to 20 nm, preferably greater than or equal to 2 nm and less than or equal to 10 nm can be formed.

Since oxidation or nitridation of the semiconductor layer by the high-density plasma treatment is a solid-phase reaction, an interface state density between the insulating layer 154 and the semiconductor layer 152 can be decreased sufficiently. In particular, in the case where the semiconductor layer is a single crystal, even when the surface of the semiconductor layer is oxidized by a solid-phase reaction by using the high-density plasma treatment, the insulating layer 154 with high uniformity and sufficiently-low interface state density can be formed.

Alternatively, the insulating layer 154 may be formed by thermally oxidizing the semiconductor layer 152 as long as the supporting substrate 100 can withstand heat. In the case of such thermal oxidation, it is necessary to use the supporting substrate 100 having a certain degree of heat resistance.

Note that hydrogen contained in the insulating layer 154 may be diffused into the semiconductor layer 152 by performing heat treatment at a temperature of higher than or equal to 350° C. and lower than or equal to 450° C. after formation of the insulating layer 154 containing hydrogen. In this case, the insulating layer 154 can be formed using silicon nitride or silicon nitride oxide by a plasma CVD method. Further, a process temperature is preferably set to be lower than or equal to 350° C. In this manner, by supplying the semiconductor layer 152 with hydrogen, defects in the semiconductor layer 152 and defects at the interface between the insulating layer 154 and the semiconductor layer 152 can be reduced effectively.

Next, a mask 156 is selectively formed over the insulating layer 154, and an impurity element imparting the first conductivity type is added to part of the semiconductor layer 152. Thus, the semiconductor region 158 having the first conductivity type is formed (see FIG. 22D). In this description here, boron is used for the impurity element imparting the first conductivity type and the first conductivity type is a p-type; however, one embodiment of the disclosed invention is not limited thereto. Aluminum or the like may be used as the impurity element imparting the first conductivity type. Alternatively, in the case where the first conductivity type is an n-type, phosphorus, arsenic, or the like can be used. The mask 156 may be formed in a manner similar to that of the mask 150.

Specifically, for example, boron may be added using $B_2H_6$ as a source gas at an accelerating voltage of 10 kV to 40 kV with a dosage of approximately $3.0\times10^{14}$ cm$^{-2}$ to $1.0\times10^{17}$ cm$^{-2}$. The conditions of the addition of the impurity element can be changed as appropriate depending on required characteristics. Dark current tends to be reduced when the dosage is reduced. This is because damage to the semiconductor layer 152 is small when an impurity element is added under a low-dosage condition, so that current due to defects is not generated while damage to the semiconductor layer 152 is large when an impurity element is added with a high-dosage condition, so that a carrier trap due to defects is generated.

Note that the mask 156 is removed after formation of the semiconductor region 158 having the first conductivity type.

After that, a mask 300 is selectively formed over the insulating layer 154 and an impurity element imparting the second conductivity type is added to part of the semiconductor layer 152. Accordingly, the semiconductor region 162 having the second conductivity type is formed, and the semiconductor region 164 having an effect of photoelectric conversion, to which the impurity element imparting the first conductivity type and the impurity element imparting the second conductivity type are not added, is formed (see FIG. 22E). The second conductivity type is different from the first conductivity type. That is, when the first conductivity type is a p-type, the second conductivity is an n-type; whereas when the first conductivity type is an n-type, the second conductivity type is a p-type. In the description here, phosphorus is used as the impurity element imparting the second conductivity type and the second conductivity type is an n-type. Alternatively, arsenic or the like can be used as the impurity element imparting n-type conductivity. The mask 300 is formed in a manner similar to that of the mask 150 or the mask 156.

Specifically, for example, phosphorus may be added using $PH_3$ as a source gas at an accelerating voltage of 10 kV to 40 kV with a dosage of approximately $1.0\times10^{14}$ cm$^{-2}$ to $5.0\times10^{16}$ cm$^{-2}$. The conditions of the addition of the impurity element can be changed as appropriate depending on required characteristics. In a manner similar to the case of addition of the impurity element imparting the first conductivity type, dark current can be suppressed when the dosage is reduced. After the semiconductor region 162 having the second conductivity type is formed, the mask 300 is removed.

Note that addition of the impurity element imparting the first conductivity type and addition of the impurity element imparting the second conductivity type, which are described above, are performed so that the width of the semiconductor region 164 having an effect of photoelectric conversion is 0.1 μm to 20 μm, preferably 3 μm to 10 μm. Needless to say, if processing accuracy of the mask 156 and the mask 300 permits, the width of the semiconductor region 164 can be 0.1 μm or less.

Figure 22F:
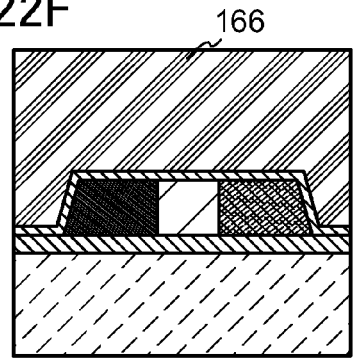

Then, the insulating layer 166 is formed so as to cover the semiconductor layer 152 and the insulating layer 154 (see FIG. 22F). Although the insulating layer 166 is not necessarily provided, when the insulating layer 166 is formed, an impurity such as an alkali metal or an alkaline earth metal can be prevented from entering the semiconductor layer 152. In addition, a surface of the photoelectric conversion element to be formed can be planarized.

The insulating layer 166 can be formed using, for example, a material such as silicon oxide, silicon nitride, silicon oxynitride, silicon nitride oxide, aluminum nitride, or aluminum oxide. In this embodiment, the insulating layer 166 is formed with a stacked-layer structure of a silicon oxynitride film with a thickness of approximately 300 nm and a silicon oxide film with a thickness of approximately 600 nm, which are formed by a CVD method. Needless to say, one embodiment of the disclosed invention is not limited thereto. A single-layer structure or a stacked-layer structure of three layers or more can be employed.

The insulating layer 166 can also be formed using an organic material having heat resistance, such as polyimide, acrylic, benzocyclobutene, polyamide, or epoxy. As an alternative to such organic materials, for example, it is also possible to use a low-dielectric constant material (a low-k material), a siloxane-based resin, PSG (phosphosilicate glass), BPSG (borophosphosilicate glass), or the like. Here, the siloxane-based resin corresponds to a resin including a Si—O—Si bond which is formed using a siloxane-based material as a starting material. The following method can be employed as appropriate depending on the material: a method such as a CVD method, a sputtering method, an SOG method, spin coating, dip coating, spray coating, or a droplet discharging method (e.g., ink jetting, screen printing, or offset printing), or with a tool (equipment) such as a doctor knife, a roll coater, a curtain coater, or a knife coater.

Figure 22G:
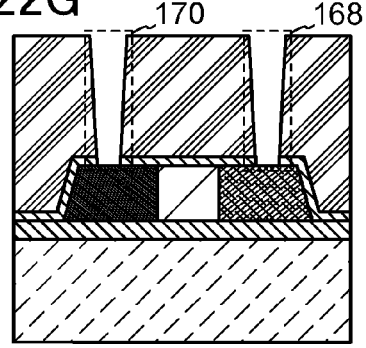

Next, a contact hole 168 and a contact hole 170 are formed in the insulating layer 154 and the insulating layer 166 so that the semiconductor layer 152 is partly exposed (see FIG. 22G). Here, specifically, the contact hole 168 and the contact hole 170 are formed so that the semiconductor region 158 having the first conductivity type and the semiconductor region 162 having the second conductivity type are partly exposed. The contact hole 168 and the contact hole 170 can be formed by etching treatment or the like after selective formation of the mask. As the etching treatment, dry etching using a mixed gas of $CHF_3$ and He as an etching gas can be employed; however, one embodiment of the disclosed invention is not limited thereto.

Figure 22H:
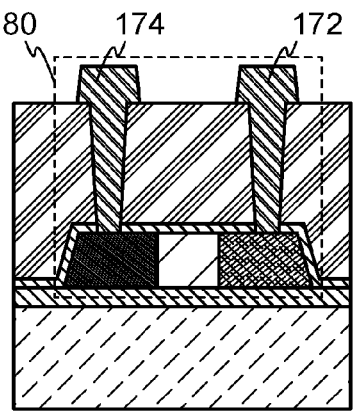

A conductive layer which is in contact with the semiconductor layer 152 through the contact holes is formed and then patterned so that the first electrode 172 and the second electrode 174 are formed (see FIG. 22H). The conductive layer from which the first electrode 172 and the second electrode 174 are formed can be formed by a CVD method, a sputtering method, an evaporation method, or the like. Specifically, as a material of the conductive layer, aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), silicon (Si), or the like can be used. Moreover, an alloy containing the above-described material as its main component or a compound containing the above-described material may be used. Note that the conductive layer may have a single-layer structure or a stacked-layer structure.

As an example of an alloy containing aluminum as its main component, an alloy containing aluminum as its main component and also containing nickel can be given. In addition, an alloy containing aluminum as its main component and also containing nickel and one or both of carbon and silicon can also be given as an example thereof. Since aluminum and aluminum silicon (Al—Si) have low resistance and are inexpensive, aluminum and aluminum silicon are suitable as a material for forming the first electrode 172 and the second electrode 174. In particular, aluminum silicon is preferable because a hillock can be prevented from being generated due to resist baking at the time of patterning. Further, a material in which Cu is mixed into aluminum at approximately 0.5% may be used instead of silicon.

In the case where the conductive layer is formed with a stacked-layer structure so that the first electrode 172 and the second electrode 174 have a stacked-layer structure, a stacked-layer structure of a barrier film, an aluminum silicon film, and a barrier film; a stacked-layer structure of a barrier film, an aluminum silicon film, a titanium nitride film, and a barrier film; or the like may be used, for example. Note that the barrier film refers to a film formed using titanium, a nitride of titanium, molybdenum, a nitride of molybdenum, or the like. By formation of the conductive film such that an aluminum silicon film is interposed between barrier films, generation of hillocks of aluminum or aluminum silicon can be further prevented. When a barrier film is formed using titanium, which is an element having a high reducing property, even if a thin oxide film is formed over the semiconductor region 158 having the first conductivity type and the semiconductor region 162 having the second conductivity type, the oxide film is reduced by titanium contained in the barrier film, so that favorable contact between the semiconductor region 158 having the first conductivity type and the first electrode 172 and between the semiconductor region 162 having the second conductivity type and the second electrode 174 can be obtained. Further, it is also possible to stack a plurality of barrier films. In that case, for example, a five-layer structure of titanium, titanium nitride, aluminum silicon, titanium, and titanium nitride which are stacked from the bottom, or a stacked-layer structure of more than five layers can be employed.

As the conductive layer, tungsten silicide formed by a chemical vapor deposition method using a $WF_6$ gas and a $SiH_4$ gas may be used. Alternatively, tungsten formed by hydrogen reduction of $WF_6$ may be used for the conductive layer.

Through the above steps, the photoelectric conversion element 180 is formed over the supporting substrate 100 having a light-transmitting property. The photoelectric conversion element manufactured by the method described in this embodiment can include a thick single crystal semiconductor layer. Therefore, the amount of current flowing to the photoelectric conversion element can be increased, so that the photoelectric conversion efficiency is increased; thus, element characteristics can be improved. Accordingly, sensitivity as an optical sensor can be improved. In addition, an optical sensor can be miniaturized.

This embodiment can be used for a display device in which pixels each having an optical sensor are arranged in matrix, for example. The display device includes a pixel having an optical sensor and a display element. The photoelectric conversion element 180 can be used as the optical sensor.

This embodiment can be implemented in combination with any of the above embodiments as appropriate.

[Embodiment 6]

In this embodiment, an example of a semiconductor device using an SOI substrate described in Embodiment 1 will be described with reference to FIGS. 23A and 23B and FIGS. 24A to 24D. Since an SOI substrate including a thick single crystal semiconductor layer is suitable for a semiconductor device described in this embodiment, an SOI substrate manufactured by the method described in Embodiment 1 is preferably used. Alternatively, an SOI substrate manufactured by the method described in Embodiment 2 may be used. Note that the same portions as those in the above-described drawings are denoted by the same reference numerals and the description thereof is omitted.

<Outline of Semiconductor Device>

Figure 23A:
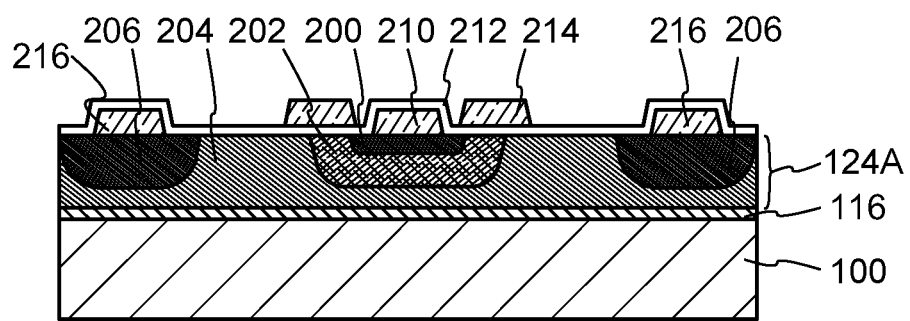
FIGS. 23A and 23B are respectively a cross-sectional view and a top view of a semiconductor device according to an embodiment.
Figure 23B:
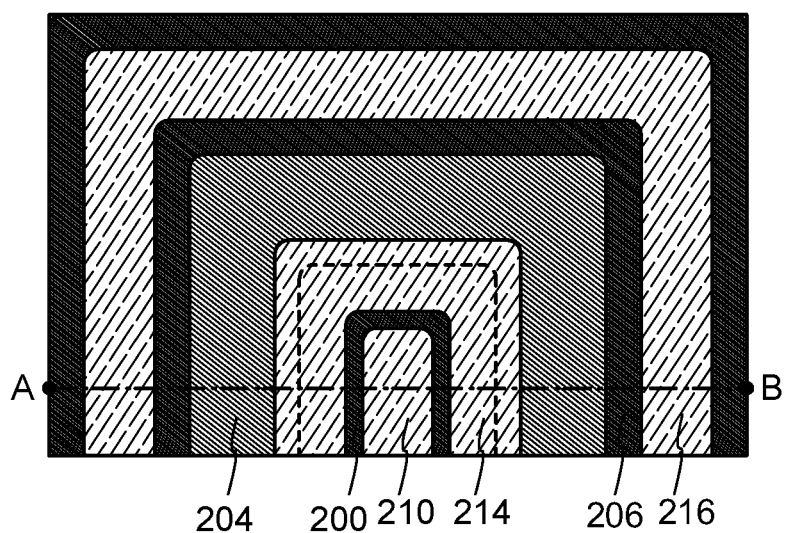

FIGS. 23A and 23B illustrate an example of a structure of a semiconductor device. FIG. 23A is a cross-sectional view, and FIG. 23B is a plane view. Note that FIG. 23A corresponds to a cross section taken along line A-B of FIG. 23B.

The insulating layer 116 and the second single crystal semiconductor layer 124A are provided in this order over the supporting substrate 100 (see FIG. 23A). The second single crystal semiconductor layer 124A includes a first region 200 having a first conductivity type, a second region 202 having a second conductivity type which is different from the first conductivity type, a third region 204 having the first conductivity type, and a fourth region 206 which is in contact with the third region 204. Here, the third region 204 corresponds to a region of the second single crystal semiconductor layer 124A other than the first region 200, the second region 202, and the fourth region 206.

A first electrode 210 which functions as a source electrode (or a drain electrode) is provided in contact with the first region 200. A second electrode 214 which functions as a gate electrode is provided in a region overlapping with the second region 202 with a gate insulating layer 212 therebetween. A third electrode 216 which functions as a drain electrode (or a source electrode) is provided in contact with the fourth region 206 (see FIG. 23A).

Note that when seen from the above, the second electrode 214 which functions as a gate electrode is provided in the periphery of the first electrode 210 which functions as a source electrode (or a drain electrode) and the third electrode 216 which functions as a drain electrode (or a source electrode) is provided in the periphery of the second electrode 214 (see FIG. 23B). In FIGS. 23A and 23B, although the semiconductor device has a structure in which the first electrode 210 is provided at the center of the semiconductor device and the second electrode 214 and the third electrode 216 are provided in the periphery of the first electrode 210, the structure of a semiconductor device is not limited to this.

The first region 200 is a region having the first conductivity type. The first conductivity type may be an n-type or a p-type. When seen from the above, the first region 200 is formed so as to overlap with the first electrode 210 which functions as a source electrode (or a drain electrode) (see FIG. 23B). In addition, the peripheral portion of the first region 200 may be overlapped with the second electrode 214 which functions as a gate electrode. The depth direction of the first region 200 is required not to reach a region having high conductivity (see FIG. 23A).

The second region 202 is provided outside the first region 200 and is a region having the second conductivity type which is different from the first conductivity type. That is, in the case where the first conductivity type is an n-type, the second conductivity type is a p-type; whereas in the case where the first conductivity type is a p-type, the second conductivity type is an n-type.

When seen from the above, the second region 202 is formed so as to cover the outer circumference of the first region 200. In addition, the second region 202 is formed so as to overlap with the second electrode 214 which functions as a gate electrode (see FIG. 23B).

The second region 202 reaches a region deeper than the first region 200 in the depth direction (see FIG. 23A). Accordingly, when voltage is not applied to the second electrode 214 which functions as a gate electrode to turn on the semiconductor device, insulation between the first electrode 210 which functions as a source electrode (or a drain electrode) and the third electrode 216 which functions as a drain electrode (or a source electrode) is secured.

The third region 204 is a region having the first conductivity type. This region is formed in almost the entire area of the second single crystal semiconductor layer 124A. The third region 204 functions as a current path. Note that the first region 200 and the third region 204 are separated from each other by the second region 202.

The fourth region 206 is a region having the first conductivity type. Note that it is preferable that the concentration of an impurity element added to the fourth region 206 be higher than that of an impurity element added to the third region 204 in order to realize ohmic contact between the fourth region 206 and the third region 216; however, one embodiment of the disclosed invention is not limited thereto. The concentration of an impurity element added to the fourth region 206 may be the same as that of an impurity element added to the third region 204.

When seen from the above, the fourth region 206 is formed so as to overlap with the third electrode 216 which functions as a drain electrode (or a source electrode) (see FIG. 23B).

The gate insulating layer 212 is formed by a method for oxidizing the second single crystal semiconductor layer 124A or a method for depositing an insulating material. As the method for depositing an insulating material, a method for forming silicon oxide, silicon oxynitride, or the like by a thermal CVD method or a plasma CVD method can be employed.

The first electrode 210 is formed in contact with the first region 200. The third electrode 216 is formed in contact with the fourth region 206. In the case where the first conductivity type is an n-type, the first electrode 210 which functions as a source electrode is negatively biased and the third electrode 216 which functions as a drain electrode is positively biased while the semiconductor device operates normally.

The second electrode 214 which functions as a gate electrode is insulated from the first region 200, the second region 202, the third region 204, and the fourth region 206 by being provided over the gate insulating layer 212. An upper portion of the second electrode 214 is preferably covered with an insulating layer. Insulation of the second electrode 214 from the first electrode 210 and the third electrode 216 can be secured by the insulating layer.

<Operation of Semiconductor Device>

In the case where the first region 200 has n-type conductivity, the second region 202 has p-type conductivity, and the third region 204 and the fourth region 206 have n-type conductivity, an npn junction is formed between the first electrode 210 which functions as a source electrode and the third electrode 216 which functions as a drain electrode. Accordingly, when bias is not applied to the second electrode 214 which functions as a gate electrode, only a small amount of current flows.

When positive bias is applied to the second electrode 214, negative charges (electrons) are induced near the interface with the gate insulating layer 212 in the second region 202 which overlaps with the second electrode 214, and the interface with the gate insulating layer 212 in the second region 202 becomes a channel, whereby current flows between the first electrode 210 and the third electrode 216.

<Modification Example>

The semiconductor device shown in the FIGS. 23A and 23B can operate differently from the above by changing the structure slightly. For example, the conductivity type of the fourth region 206 can be the same as that of the second region 202. In this case, the first electrode 210 which is in contact with the first region 200 is called an emitter electrode and the third electrode 216 which is in contact with the fourth region 206 is called a collector electrode.

In this structure, when positive bias is applied to the second electrode 214 which functions as a gate electrode, channel is formed in the second region 202, whereby current flows. Here, the fourth region 206 has p-type conductivity.

The semiconductor device has a structure of an insulated-gate field effect transistor on an input side and a structure of a bipolar transistor on an output side. Therefore, the semiconductor device is driven with a voltage between the second electrode 214 which functions as a gate electrode and the first electrode 210 which functions as an emitter electrode, and can be turned on or off by input signals to the second electrode 214. By the structure, switching operation can be faster, and self-heating is suppressed due to low on resistance, whereby control of a large amount of electrical power can be facilitated.

<Manufacturing Process>

A manufacturing process of the semiconductor device shown in FIGS. 23A and 23B will be described with reference to FIGS. 24A to 24D.

Figure 24A:
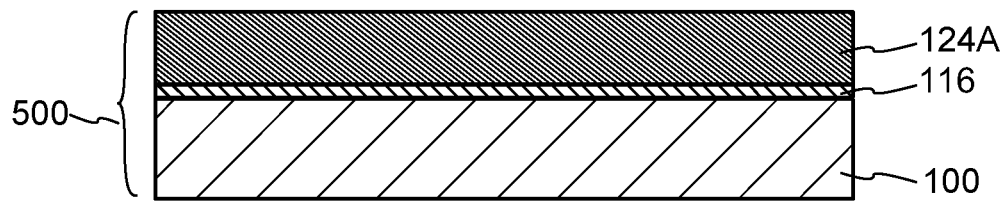
FIGS. 24A to 24D show a manufacturing process of a semiconductor device according to an embodiment.

First, an SOI substrate 500 is manufactured in accordance with the method described in Embodiment 1 (see FIG. 24A). The SOI substrate 500 has a structure in which the insulating layer 116 and the second single crystal semiconductor layer 124A are formed in this order over the supporting substrate 100. An impurity element imparting the first conductivity type is added to the second single crystal semiconductor layer 124A.

As an impurity element that can be added to the second single crystal semiconductor layer 124A, phosphorus (P) or arsenic (As) which imparts n-type conductivity, and boron (B) or aluminum (Al) which imparts p-type conductivity, and the like can be employed. Here, the case where phosphorus (P) is added so that the second single crystal semiconductor layer 124A has n-type conductivity is described. That is, the first conductivity type is an n-type here.

Figure 24B:
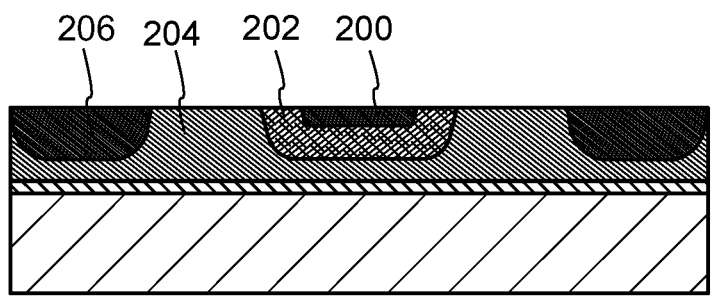

Next, an impurity element imparting p-type conductivity (for example, boron) and an impurity element imparting n-type conductivity (for example, phosphorus) are selectively added to the second single crystal semiconductor layer 124A, whereby the first region 200 having the first conductivity type, the second region 202 having the second conductivity type which is different from the first conductivity type, and the fourth region 206 having the first conductivity type are formed (see FIG. 24B). Accordingly, the region of the second single crystal semiconductor layer 124A other than the first region 200, the second region 202, and the fourth region 206 becomes the third region 204. Here, part of the second region 202 functions as a channel formation region, the first region 200 functions as a source region (or a drain region), and the fourth region 206 functions as a drain region (or a source region) later. Note that it is preferable that the impurity concentration in the first region 200 is higher than that in the third region 204.

Figure 24C:
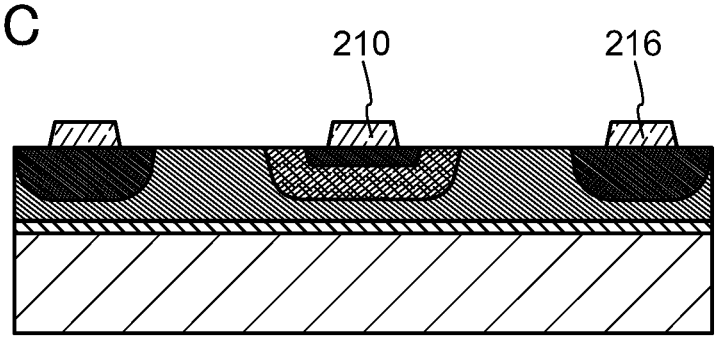

After forming the first region 200, the second region 202, the third region 204, and the fourth region 206, the first electrode 210 is selectively formed so as to be in contact with the first region 200 and the third electrode 216 is selectively formed so as to be in contact with the fourth region 206 (see FIG. 24C). Here, the first electrode 210 functions as a source electrode (or a drain electrode) and the third electrode 216 functions as a drain electrode (or a source electrode).

A material having high heat resistance is preferably used as the first electrode 210 and the third electrode 216. For example, titanium, molybdenum, tungsten, tantalum, chromium, or nickel can be used. In addition, a material having low resistance such as aluminum and copper may be used. Further, a semiconductor material (for example, polysilicon) to which an impurity element imparting a conductivity type is added may be used.

Figure 24D:
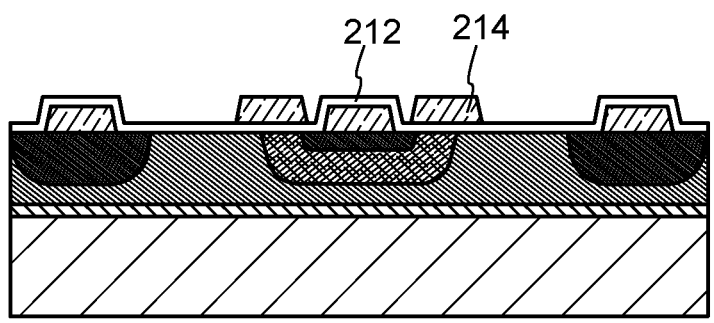

Then, the gate insulating layer 212 is formed so as to cover the second single crystal semiconductor layer 124A, the first electrode 210, and the third electrode 216, and the second electrode 214 which functions as a gate electrode is selectively formed over the gate insulating layer 212 (see FIG. 24D). Here, it is preferable to form the second electrode 214 so that part of the second electrode 214 overlaps with the first region 200. Thus, the concentration of electric field is alleviated, whereby higher withstand voltage can be obtained. After that, an insulating layer may be formed so as to cover the second electrode 214.

The gate insulating layer 212 can be formed using a material such as silicon oxide, silicon nitride, silicon oxynitride, silicon nitride oxide, hafnium oxide, aluminum oxide, or tantalum oxide. As a formation method, a thermal oxidation method (a thermal nitridation method), a plasma CVD method, a sputtering method, a method using oxidation or nitridation by high-density plasma treatment, or the like can be employed.

The second electrode 214 can be formed in a manner similar to those of the first electrode 210 and the third electrode 216.

As described above, a semiconductor device which is a so-called power MOSFET can be manufactured. As described in this embodiment, increasing the withstand voltage of a semiconductor element, reducing a loss of electric power, and the like can be realized by using a thick single crystal semiconductor layer for a power MOSFET. Further, as described in the above embodiments, an SOI substrate including a single crystal semiconductor layer which has a large thickness and favorable crystallinity can be easily provided at low cost; therefore, manufacturing cost of a semiconductor element and a semiconductor device can be suppressed.

This embodiment can be implemented in combination with any of the above embodiments as appropriate.

EXAMPLE 1

In this example, the plasma treatment using a rare gas described in Embodiment 1 or 2 will be described.

First, a single crystal silicon layer is formed over a glass substrate using the method described in Embodiment 1. In this example, a stacked-layer structure of a silicon oxide layer having a thickness of 100 nm and a single crystal silicon layer having a thickness of 100 nm was formed over a glass substrate having a thickness of 0.7 mm. After that, an amorphous silicon layer having a thickness of 100 nm was formed over the single crystal silicon layer.

The formation conditions of the amorphous silicon layer are as follows.

Deposition method: plasma CVD
Source gas: silane (100 sccm)
Electric power (frequency): 50 W (27 MHz)
Pressure: 35 Pa
Distance between electrodes: 25 mm
Deposition temperature: 200° C.
Thickness: 100 nm Next, the conditions of the plasma treatment are as follows. Argon is used as a rare gas.

Pressure: 0.5 Pa
Source gas: argon (300 sccm)
Electric power: 350 W
Time: 60 seconds The case where planarization with argon plasma is performed before the amorphous silicon layer is formed (Comparative Example 2) and the case where planarization with argon plasma after the amorphous silicon layer is formed (Sample B) are compared in terms of average surface roughness (Ra). Note that the average surface roughness indicates the average surface roughness after a process in which planarization is performed and then heat treatment is performed on the amorphous silicon layer for solid-phase epitaxial growth. Note that in the case where argon plasma treatment is performed after the amorphous silicon layer is formed, reduction in thickness of the amorphous silicon layer is approximately 27 nm.

TABLE 1

| | average surface roughness Ra [nm] | | | |
|---|---|---|---|---|
| | measurement point 1 | measurement point 2 | measurement point 3 | average |
| Sample B | 6.18 | 5.94 | 5.98 | 6.04 |
| Comparative Example 2 | 14.19 | 14.60 | 14.92 | 14.57 |

From Table 1, it is found that Sample B on which argon plasma treatment is performed after the amorphous silicon layer is formed has a smaller average surface roughness than Comparative Example 2 on which argon plasma treatment is performed before the amorphous silicon layer is formed. Note that in Comparative Example 2, a crystal state of the single crystal semiconductor layer serving as a seed of epitaxial growth was degraded due to plasma damage, and subsequent epitaxial growth did not proceed favorably.

This application is based on Japanese Patent Application serial no. 2009-266151, Japanese Patent Application serial no. 2009-266150, and Japanese Patent Application serial no. 2009-266152 filed with Japan Patent Office on Nov. 24, 2009, the entire contents of which are hereby incorporated by reference.

What is claimed is:

1. A method for manufacturing an SOI substrate, comprising:
    preparing a first single crystal semiconductor layer provided over a substrate with an insulating layer interposed therebetween, the first single crystal semiconductor layer being in direct contact with the insulating layer;
    forming an amorphous semiconductor layer over the first single crystal semiconductor layer by a plasma CVD method at a deposition temperature of higher than or equal to 150° C. and lower than 250° C. in an atmosphere containing only a silane-based gas; and
    performing heat treatment to make the amorphous semiconductor layer solid-phase epitaxially grow, so that a second single crystal semiconductor layer is formed over the first single crystal semiconductor layer.

2. The method for manufacturing an SOI substrate according to claim 1, wherein the second single crystal semiconductor layer is removed from the first single crystal semiconductor layer.

3. The method for manufacturing an SOI substrate according to claim 1, wherein a portion of the second single crystal semiconductor layer is removed.

4. The method for manufacturing an SOI substrate according to claim 1, wherein the amorphous semiconductor layer is subjected to plasma treatment using a rare gas to be planarized before the heat treatment.

5. The method for manufacturing an SOI substrate according to claim 1, wherein the heat treatment is performed at 550° C. or higher.

6. The method for manufacturing an SOI substrate according to claim 1, further comprising:
    irradiating a single crystal semiconductor substrate with an ion to form a damaged region in the single crystal semiconductor substrate;
    bonding the single crystal semiconductor substrate and the substrate to each other with the insulating layer therebetween; and
    splitting the single crystal semiconductor substrate along the damaged region to form the first single crystal semiconductor layer over the substrate with the insulating layer interposed therebetween.

7. The method for manufacturing an SOI substrate according to claim 1, wherein the substrate is a glass substrate or a plastic substrate.

8. A method for manufacturing an SOI substrate, comprising:
    preparing a first single crystal semiconductor layer provided over a substrate with an insulating layer interposed therebetween, the first single crystal semiconductor layer being in direct contact with the insulating layer;
    forming an amorphous semiconductor layer over the first single crystal semiconductor layer by a plasma CVD method at a deposition temperature of higher than or equal to 150° C. and lower than 250° C. in an atmosphere containing only a silane-based gas; and
    performing heat treatment to make the amorphous semiconductor layer solid-phase epitaxially grow, so that a second single crystal semiconductor layer including the first single crystal semiconductor layer is formed.

9. The method for manufacturing an SOI substrate according to claim 8, wherein a portion of the second single crystal semiconductor layer is removed from the first single crystal semiconductor layer.

10. The method for manufacturing an SOI substrate according to claim 8, wherein a portion of the second single crystal semiconductor layer, which has solid-phase epitaxially grown, is removed.

11. The method for manufacturing an SOI substrate according to claim 8, wherein crystallinity of the second single crystal semiconductor layer is higher than crystallinity of the first single crystal semiconductor layer.

12. The method for manufacturing an SOI substrate according to claim 8, wherein the amorphous semiconductor layer is subjected to plasma treatment using a rare gas to be planarized before the heat treatment.

13. The method for manufacturing an SOI substrate according to claim 8, wherein the heat treatment is performed at 550° C. or higher.

14. The method for manufacturing an SOI substrate according to claim 8, further comprising:
    irradiating a single crystal semiconductor substrate with an ion to form a damaged region in the single crystal semiconductor substrate;
    bonding the single crystal semiconductor substrate and the substrate to each other with the insulating layer therebetween; and
    splitting the single crystal semiconductor substrate along the damaged region to form the first single crystal semiconductor layer over the substrate with the insulating layer interposed therebetween.

15. The method for manufacturing an SOI substrate according to claim 8, wherein the substrate is a glass substrate or a plastic substrate.

16. The method for manufacturing a semiconductor device comprising the SOI substrate according to claim 1, further comprising:
    selectively adding impurity elements imparting first and second conductivities to the second single crystal semiconductor layer to form a first region having a first conductivity type, a second region having a second conductivity type which is different from the first conductivity type, a fourth region having the first conductivity type, and a third region of the second single crystal semiconductor layer other than the first region, the second region, and the fourth region;
    forming a first electrode in contact with the first region and a third electrode in contact with the fourth region;

forming a gate insulating film to cover the second single crystal semiconductor layer, the first electrode, and the third electrode; and forming a second electrode over the gate insulating film.

* * * * *